US007749666B2

(12) United States Patent
Gassner et al.

(10) Patent No.: US 7,749,666 B2
(45) Date of Patent: Jul. 6, 2010

(54) SYSTEM AND METHOD FOR MEASURING AND ANALYZING LITHOGRAPHIC PARAMETERS AND DETERMINING OPTIMAL PROCESS CORRECTIONS

(75) Inventors: Michael J. Gassner, San Jose, CA (US); Stefan Hunsche, Sunnyvale, CA (US); Yu Cao, Cupertino, CA (US); Jun Ye, Palo Alto, CA (US); Moshe E. Preil, Sunnyvale, CA (US)

(73) Assignee: ASML Netherlands B.V., Veldhoven (NL)

( * ) Notice: Subject to any disclaimer, the term of this patent is extended or adjusted under 35 U.S.C. 154(b) by 934 days.

(21) Appl. No.: 11/462,022

(22) Filed: Aug. 2, 2006

(65) Prior Publication Data

US 2007/0035712 A1    Feb. 15, 2007

Related U.S. Application Data

(60) Provisional application No. 60/706,269, filed on Aug. 9, 2005.

(51) Int. Cl.
G03C 5/00 (2006.01)
G01B 9/00 (2006.01)
G01B 9/08 (2006.01)
G01B 11/00 (2006.01)
G01N 21/00 (2006.01)

(52) U.S. Cl. .......................... 430/30; 356/609; 356/125; 356/126; 356/392; 356/393; 356/394; 356/237.1

(58) Field of Classification Search ................. 356/609, 356/125–126, 392–394, 237.1–237.5; 250/208.1; 430/5, 30
See application file for complete search history.

(56) References Cited

U.S. PATENT DOCUMENTS

| 6,240,219 | B1 * | 5/2001 | Gregory ..................... 382/321 |
| 6,741,331 | B2 * | 5/2004 | Boonman et al. ............. 355/67 |
| 6,803,554 | B2 | 10/2004 | Ye et al. |
| 6,806,456 | B1 | 10/2004 | Ye et al. |
| 6,828,542 | B2 | 12/2004 | Ye et al. |
| 6,969,837 | B2 * | 11/2005 | Ye et al. .................. 250/208.1 |
| 6,969,864 | B2 * | 11/2005 | Ye et al. .................. 250/559.4 |
| 2003/0047694 | A1 * | 3/2003 | Van Der Laan ............. 250/548 |

OTHER PUBLICATIONS

"What is Self Calibration", web page http://selfcalibration.interconnect.com. downloaded Dec. 15, 2009, 2 pages.

* cited by examiner

Primary Examiner—Mark F Huff
Assistant Examiner—Jonathan Jelsma
(74) Attorney, Agent, or Firm—Pillsbury Winthrop Shaw Pittman LLP

(57) ABSTRACT

A method of using an in-situ aerial image sensor array is disclosed to separate and remove the focal plane variations caused by the image sensor array non-flatness and/or by the exposure tool by collecting sensor image data at various nominal focal planes and by determining best focus at each sampling location by analysis of the through-focus data. In various embodiments, the method provides accurate image data at best focus anywhere in the exposure field, image data covering an exposure-dose based process window area, and a map of effective focal plane distortions. The focus map can be separated into contributions from the exposure tool and contributions due to topography of the image sensor array by suitable calibration or self-calibration procedures. The basic method enables a wide range of applications, including for example qualification testing, process monitoring, and process control by deriving optimum process corrections from analysis of the image sensor data.

13 Claims, 19 Drawing Sheets

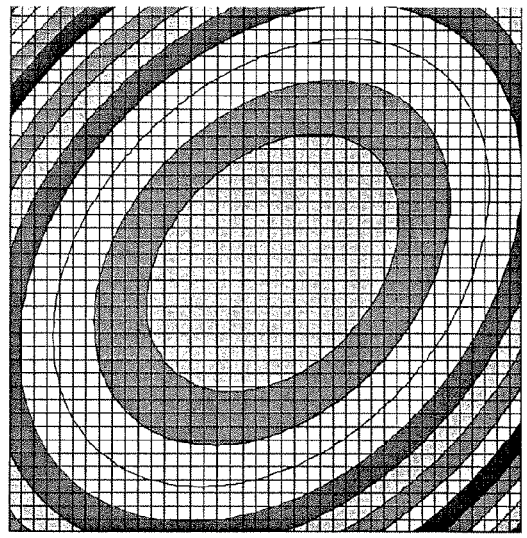 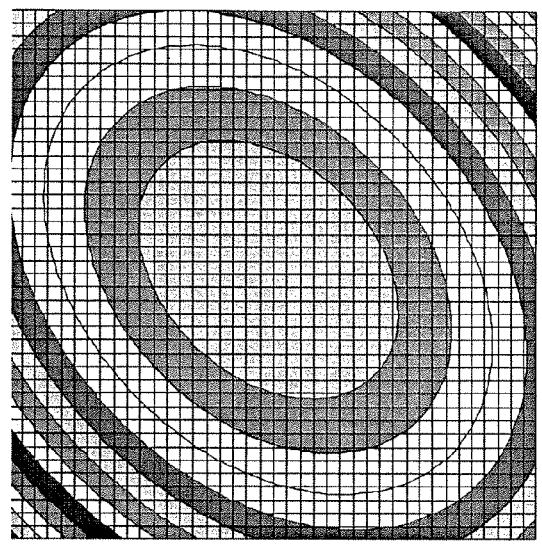
FIG. 12A                    FIG. 12B

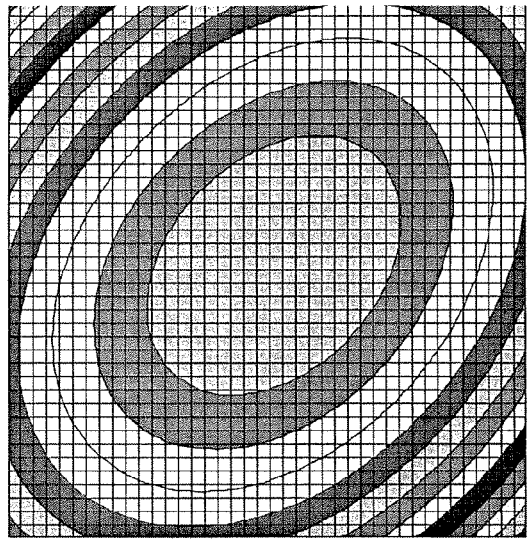 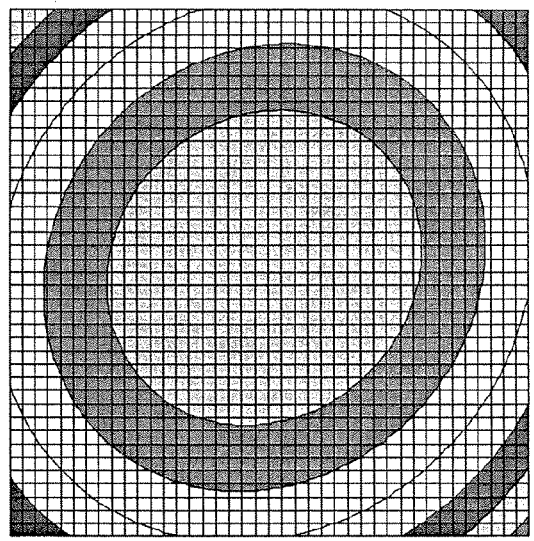
FIG. 13A    FIG.13B
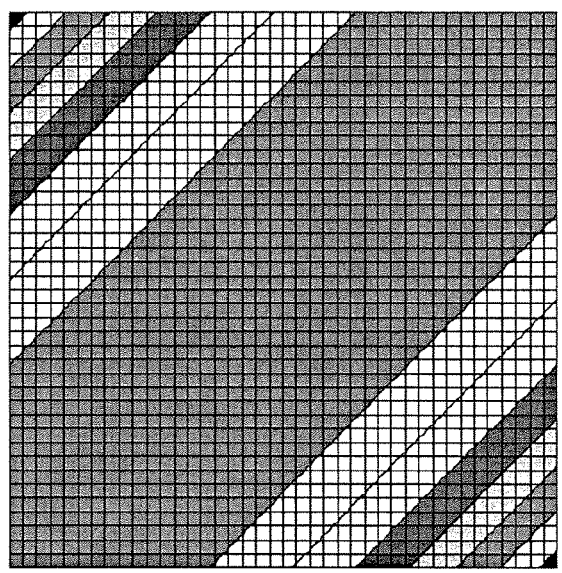
FIG. 13C

SYSTEM AND METHOD FOR MEASURING AND ANALYZING LITHOGRAPHIC PARAMETERS AND DETERMINING OPTIMAL PROCESS CORRECTIONS

CROSS-REFERENCE TO RELATED APPLICATION

This application claims the benefit of U.S. Provisional Patent Application No. 60/706,269, entitled "System and Methods for Measuring and Analyzing Lithographic Parameters and Determining Optimal Process Corrections." The subject matter of this related application is hereby incorporated by reference in its entirety.

FIELD OF THE INVENTION

This invention relates generally to optical lithography and more particularly to measuring and analyzing lithographic parameters and determining optimal process corrections.

BACKGROUND

The integrated circuit industry has, since its inception, maintained a remarkable growth rate by driving increased device functionality at lower cost. Leading edge devices today provide the computing power of computers that used to occupy entire rooms at a mere fraction of the cost. Many of today's low-cost consumer devices include functionality that only a few years ago was unavailable at any cost, such as video cell phones, ultra-portable media players, and wireless or ultra-wideband Internet devices. One of the primary enabling factors of this growth has been the ability of optical lithography processes to steadily decrease the smallest feature size that can be patterned as part of the integrated circuit pattern. This steady decline in feature size and cost while at the same time printing more features per circuit is commonly referred to as "Moore's Law" or the lithography "roadmap."

The lithography process involves creating a master pattern on a mask or reticle, then replicating that pattern faithfully onto the device wafers. Typically the master pattern is projected onto a photosensitive film deposited on the top surface of the product wafers; this film is referred to as "photoresist" or simply "resist." Projection is typically accomplished using an exposure tool usually referred to as a "scanner" or "stepper." Most exposure tools in use today demagnify the master pattern by a factor of four or five times; this reduction ratio is often referred to by the incongruous phrase "magnification ratio." For a feature intended to be 65 nm wide at the wafer level, e.g., the corresponding feature would be on the order of 260 nm wide at the reticle level. This difference in feature sizes between the reticle level and the wafer level is often implied, and for the remainder of this application, the features on the reticle will be referred to by their wafer-level dimensions, with the understanding that they are sized appropriately at the reticle level to produce the stated dimensions at the wafer level. As a result, a "65 nm feature on the reticle," e.g., is understood to mean a "feature of the appropriate size at the reticle level to produce a 65 nm resist feature at the wafer level."

Because of the highly non-linear nature of the pattern transfer process described in more detail below, not every individual feature on the reticle results in a wafer-level pattern in which the size is exactly equal to the reticle-level pattern size divided by the reduction ratio. This non-linearity is a key reason for the growing number of measurements needed to characterize the pattern transfer process, as well as for the growing number of patterns that need to be modified at the reticle level through the addition of optical proximity correction (OPC) and/or sub-resolution assist features (SRAFs) such as serifs and/or scattering bars.

The imaging system of the exposure tool, including all of the illumination and projection optics, as well as sophisticated electro-mechanical systems for aligning and moving the reticle and wafer relative to each other play a critical role in determining how well the master pattern is replicated. Any imperfections in the master pattern due to errors in the reticle manufacturing process or in the replication of the master pattern due to imperfections or aberrations in the exposure tool will reduce the quality and fidelity of the replicated patterns on the wafer, resulting in the devices not performing as intended.

A critical parameter of interest in qualifying the fidelity of the replicated images is the "critical dimension" of the pattern. The critical dimension is intended as a metric of the width of the features printed in the photoresist layer on the wafer. Since the resist patterns have finite thickness, the critical dimension is actually a two-dimensional measurement applied to a three-dimensional feature. Typically critical dimension is supposed to represent the width of the most critical features (usually the smallest geometries) in the device, measured at the base of the three-dimensional profile. In practice, it is often difficult to measure the resist width at the resist-substrate interface, and suitable proxies are employed to represent the critical dimension depending on which tools are used for the measurement. In common parlance, the term critical dimension is now used to represent almost any line-width measurement performed on the resist pattern.

At feature sizes below 100 nm, which are common today, the control of the critical dimensions on product wafers requires ever increasing amounts of critical dimension data and increasingly sophisticated process analysis and correction algorithms. In earlier generations of technology, typically only one or at most two process control inputs (dose and possibly focus) would be adjusted to control the printed critical dimensions relative to a desired target. In typical processes, only a few points across the wafer and at most one or two points across the field might be measured and controlled. Today, the number and the type of data collected have increased dramatically. Hundreds or thousands of points are often measured on tool and process characterization wafers to set up the exposure tool and process. Fewer points are available on product wafers due to limitations of available space for test structures on the device and the need to produce results in a short time, but the number of data points measured in production today is many times larger than the number that was measured a few years ago. Critical dimensions of different feature types (e.g., target dimension, pitch, and shape) are often measured at multiple points across the field, and many more adjustments may be made to the process to correct not only the mean-to-target offset but also the total critical dimension distribution across the field, across the wafer, and across the different feature types.

Current methods for collecting critical dimension data across the full field of an exposure tool are too time consuming and are usually limited to a very small number of measurement locations and/or features. An "image sensor array" was used in a new approach described in U.S. Pat. Nos. 6,828,542, 6,803,554, and 6,806,456, the subject matters of which are hereby incorporated by reference in their entirety. Such an image sensor array can measure the projected aerial image in-situ with several million sampling points across the field of the exposure tool, i.e., at the focal plane of a lithography exposure tool. An image sensor array with similar functionality may also be integrated within the wafer stage or the wafer chuck of the exposure system. From the data delivered by the in-situ image sensor array, printed critical dimensions may be predicted through a calibrated resist model, or image parameters such as contrast of edge slope may be analyzed directly. The vast increase in data volume made available by a large area image sensor array covering the complete exposure field of an exposure tool enables new methods of process and tool monitoring and process control, using either monitor or product reticles.

Monitor reticle applications of an in-situ aerial image sensor array may include monitoring and determining corrections for a large number of system parameters that affect imaging quality. These parameters include, e.g., focal plane variations of the exposure tool or other errors and changes in the illumination and/or projection optical systems that may cause unacceptably large variations in critical dimension distributions or other image parameters as a function of position within the exposure field and/or feature type. Examples of such errors may include, e.g., spherical aberration, astigmatism, focal plane curvature, and/or de-centering or incorrect partial coherence of the illumination apertures. These types of errors may escape detection if only a limited number of feature types at a limited number of points are evaluated. The use of a monitor reticle—with test structures laid out on a grid that matches the regular grid of individual image sensor elements of the image sensor array—maximizes the number of samples and pattern types that can be simultaneously measured. With the massive data volumes enabled by the new sensor technology, a large number of image system parameters can be uniquely addressed and unambiguously monitored in detail.

Product reticle applications of an in-situ aerial image sensor array involve various methods to sample critical dimensions or other image parameters across the reticle. The data sampling and data acquisition may be optimized to most effectively predict the full critical dimension distribution and other imaging performance across the exposure field. Any measured data will result from the combined effect of the specific combination of reticle and exposure tool being tested. The reticle's critical dimension variations or two-dimensional pattern shape variations on the reticle tend to have highly non-linear effects on the patterns formed at the image plane. The variation there may depend on the magnitude of the reticle variation, the nominal target shape and size, the local environment on the reticle near the feature in question, and the exposure and focus conditions or other optical parameters of the exposure tool. Critical dimension errors at the reticle level may result in very different critical dimension errors at the wafer level, depending on where in the field the errors occur and exactly what types of features are being patterned. This non-linearity is often referred to as Mask Error Factor (MEF) or Mask Error Enhancement Factor (MEEF), although in fact it is neither a simple multiplicative "factor" but a complex function of the pattern, the imaging tool, and the process conditions.

Consequently, verifying and predicting correctly the imaging performance of an actual production reticle is generally a challenging task. It is virtually impossible to test directly with sufficient density of sampling points on printed wafers whether the vast amount of OPC modifications applied to the reticle in a modern device design produce the desired edge placements and critical dimension values at every point. The actual patterning performance will depend not only on the thoroughness of the OPC design but also on the exact physical properties of the mask after being manufactured, the exact properties of the exposure tool illumination and projection optics, and the exact properties of resist processing. The use of an image sensor array based on the disclosures of U.S. Pat. Nos. 6,828,542, 6,803,554, and 6,806,456 significantly improves this situation by assessing directly the imaging performance at the focal plane while including all real mask and exposure tool effects but excluding additional uncertainties of resist processing properties (that can be separately calibrated to a model).

The image sensor array technology enables an entirely new method of qualifying the wafer-level critical dimension distributions and OPC performance by collecting millions of measurements within a few minutes, sampling different feature types at many locations across the field, and creating an exhaustive prediction of the wafer level image quality and the critical-dimension distribution that result from the particular combination of the reticle and the exposure system being measured and qualified by the image sensor array. The relatively short data acquisition time required also enables taking data at scheduled time intervals, e.g., on a regular preventive maintenance cycle, without a large impact on tool availability. This data may then be utilized to determine and monitor any process drifts over time, predict process corrections that optimize the common process window, or feed into existing statistical process control (SPC) systems.

However, the image sensor array itself introduces a new, additional source of uncertainty and variations due to possible non-perfect flatness of the image sensor array that is in practice hard to avoid completely. Due to topography of the image sensor array, each of the image sensor elements will sample the projected image at a slightly different focal position, and therefore a finite part of, e.g. the critical dimension non-uniformity, computed from the sensor data will actually be related to sensor non-flatness rather than to the exposure projection tool or the reticle properties. Consequently, an actual production wafer processed on the tool would not experience exactly the same critical dimension distribution as measured by the image sensor array, so the effectiveness of the image sensor array data for verifying across-reticle critical dimension variations or directly determining optimal process corrections would be limited. This same drawback exists both for production and monitor reticles; the true nature of the critical dimension non-uniformity induced by the reticle and the exposure tool is convolved with variations induced by the detector non-flatness, resulting in a possibly inaccurate picture of the imaging performance of the exposure tool.

The basic method of collecting data and forming high-resolution images employed in one embodiment of the present invention is described in U.S. Pat. Nos. 6,828,542, 6,803,554, and 6,806,456. With reference to FIG. 1, in one embodiment disclosed in the U.S. Pat. No. 6,828,542 patent, an image sensor array 106 includes a plurality of image sensor elements 200, including 200$a_x$, to 200$h_x$ (x=1 to 8), that measure, sense, detect and/or collect incident energy or radiation. Image sensor array 106 is preferably embedded in an image sensor unit that is capable of being loaded into the wafer stage of an exposure tool.

In those instances where the dimensions of the active areas of image sensor elements 200 are too large to provide a desired or required spatial resolution, it may be necessary to limit, restrict, and/or reduce these sensor cells' active areas that are exposed. Hence, image sensor array 106 may include a patterned opaque film 204 that impedes, obstructs, absorbs, and/or blocks passage of photons or light of a given wavelength (that is, at the wavelength to be measured, sensed or detected by image sensor elements 200). Opaque film 204 includes apertures 206, including 206$a_x$ to 206$h_x$ (x=1 to 8), so that active areas of image sensor elements 200 are exposed only at apertures 206. As such, the spatial resolution of the energy measured by image sensor elements 200 is enhanced or improved because the portion or area of each image sensor element 200 that is effectively exposed to and/or measures, senses, detects, and/or collects energy or radiation is limited or restricted. Generally, image sensor elements 200 as well as any resolution enhancing measures, e.g., small apertures 206 formed in a light-blocking layer on top of image sensor elements 200, will be arranged on a very regular two-dimensional grid. A single exposure of image sensor array 106 is defined as a "frame."

FIG. 2 shows a portion of the same image sensor array 106 as in FIG. 1. Here, only image sensor elements $200a_x$ to $200g_x$ (x=1 to 7) are shown. The multiple overlapping aperture positions $202a_{11}$ to $202a_{13}$ schematically represent the multiple lateral exposures of the image sensor element $200a_1$, where each exposure is offset by less than the size of the aperture $206a_2$ (shown in FIG. 1). The multiple overlapping images produced by the lateral exposures of the image sensor element $200a_1$ are combined to form a large image of stitched images. Such a large combined image is referred to as a "patch."

FIG. 3A shows a single "patch" 310 composed of 16×18 overlapping exposures of a single aperture. Each individual exposure (represented by, e.g., a single circle 312) is referred to as a "pixel." FIG. 3B shows a "sub-patch," 320 which is a sub-group of exposures within a patch 310 composed of 3×3 overlapping exposures of a single aperture.

As mentioned above with reference to FIG. 1, image sensor array 106 consists of an array of individual image sensor elements 200 on a typically regular, rectangular grid. As illustrated in FIGS. 2 and 3, a set of high resolution image patches 310 (one for each image sensor element) is generated by repeated exposures of image sensor array 106 at the focal plane of the exposure tool, with small, lateral steps 290 (in the horizontal direction x) and 291 (in the vertical direction y) programmed between subsequent exposures, such that the locations of the resolution enhancing aperture cover a contiguous area of the projected image.

From the collected data samples of each image sensor element 200, a high-resolution image can then be reconstructed that covers the range of programmed lateral steps in x and y directions. The image sensor array may have several millions of image sensor elements, i.e., several million patches may be recorded in parallel. As the images are constructed from subsequent individual exposures over time, the projection conditions such as focus need to be kept constant during the data acquisition for one set of patches, using the existing, precise feedback controls of the exposure system.

FIG. 4 shows a flowchart of method steps for a prior art technique for image data preprocessing prior to image formation to reduce noise or errors in the data captured by image sensor array 106. In step 410, overlapping frames are collected over the full field of the exposure tool. In step 412, the frames are conditioned by correcting small errors in the offsets between frames on a full-frame basis. Overall intensity of each frame may also be corrected based on independent exposure data taken while the frame was being exposed. In step 414, patches are assembled using data from the conditioned frames produced in step 412. In step 416, the image patches are conditioned, where the conditioning includes noise reduction, smoothing, and classification on a patch-by-patch basis.

FIG. 5 schematically depicts an image sensor unit 524 including image sensor array 106 being exposed in an exposure tool at one particular focus offset. The exposure tool includes a mirror 512, a light source 514 to generate light 516 at a certain exposure wavelength, illumination optics 518, projection optics 522, and a chuck 526. Chuck 526 secures image sensor unit 524 in a fixed location using, for example, electrostatic or vacuum forces. The optics of the exposure tool interact with a mask 520 to project an aerial image onto image sensor array 106 in image sensor unit 524. In one embodiment, mask 520 contains the patterns to be replicated or printed onto a wafer during integrated circuit manufacturing. In another embodiment, mask 520 contains test patterns that are designed to evaluate the optical characteristics of the exposure tool. In one embodiment, image sensor unit 524 includes a processor/controller that implements data processing and analysis algorithms to process data captured by image sensor array 106. In another embodiment, the processor/controller is remote from image sensor unit 524 and is in communication with image sensor unit 524.

SUMMARY

Embodiments of the system and method of the invention enable the image sensor array to collect millions of critical dimension measurements across an exposure field at the same effective focal plane despite the non-flatness of the image sensor array itself in a very short time. As an added benefit, the system and method provide critical dimension measurements at the measured locations as a function of focus, as well as a parametric function expressing the critical dimension as a function of focus position so that the measurements provide the required data across the entire process window. The additional data density (number of points) and quality (process window data) allows for substantial improvements in lithography process control.

Embodiments of the system and method of the invention also provide a way to monitor and/or correct the performance of the image sensor array over time, the performance of the exposure tool's exposure field over time, especially any changes in the local non-flatness of the focal plane, as well as the exposure conditions (NA, sigma, adjustable aberrations), the correctable terms in the forms of the local non-flatness maps, the process window for each feature type of interest and to detect any process drift from the center of the process window and/or any change in the process window (focus and/or exposure latitude available for the process), and the impact of product wafer topography on the critical dimension patterning to determine the complete critical dimension distribution expected across the field and across the wafer for a product device wafer.

Embodiments of the system and method of the invention also provide a way to apply trend charting, statistical process control and/or advanced process control techniques to any of the correctable errors or to any metric relating to the performance of the image sensor array or the exposure tool being monitored. The method can also include closed loop feedback techniques to apply the appropriate corrections and verify the improvement in the imaging performance of the exposure tool and associated lithographic process and/or metrology performance of the image sensor array.

In one embodiment, the method comprises measuring aerial images using an image sensor array at a plurality of focal planes in an exposure tool, the image sensor array including a plurality of image sensor elements, determining a value for at least one image quality metric for each image sensor element at each of the plurality of focal planes to produce image quality metric data, fitting a parametric function to the image quality metric data, the parametric function being a function of focus, determining a best focus for each image sensor element using the fitted parametric function, calculating a difference between the best focus for each image sensor element and a nominal best focus setting of the exposure tool, and creating a focal plane map of the exposure tool that indicates the differences between the best focuses of the image sensor elements and the nominal best focus setting.

In one embodiment, the system comprises a image sensor array capable of being loaded into an exposure tool, the image sensor array including a plurality of image sensor elements, and a computer in communication with the image sensor array, the computer including an image generator configured to generate measured aerial images using data from the image sensor array, an image quality metric calculator configured to calculate image quality metric data for the measured aerial images, a data fit module configured to fit a function to the measured image quality metric data and to identify a best focus for each of the plurality of image sensor elements, and a focus map module configured to generate a focus map that reflects differences between a best focus for each of the plurality of image sensor elements and a nominal best focus of the exposure tool.

BRIEF DESCRIPTION OF THE DRAWINGS

FIGS. 12A and 12B are images measured by the image sensor array rotated 90 degrees between exposures when the non-uniformity has resulted from the image sensor array, according to one embodiment of the present invention;

FIGS. 13A and 13B are images measured by the image sensor array rotated 90 degrees between exposures when the non-uniformity has at least in part resulted from the exposure tool, according to one embodiment of the present invention;

FIG. 13C is an image showing differences between the images in FIGS. 13A and 13B;

DETAILED DESCRIPTION OF THE INVENTION

Figure 6:
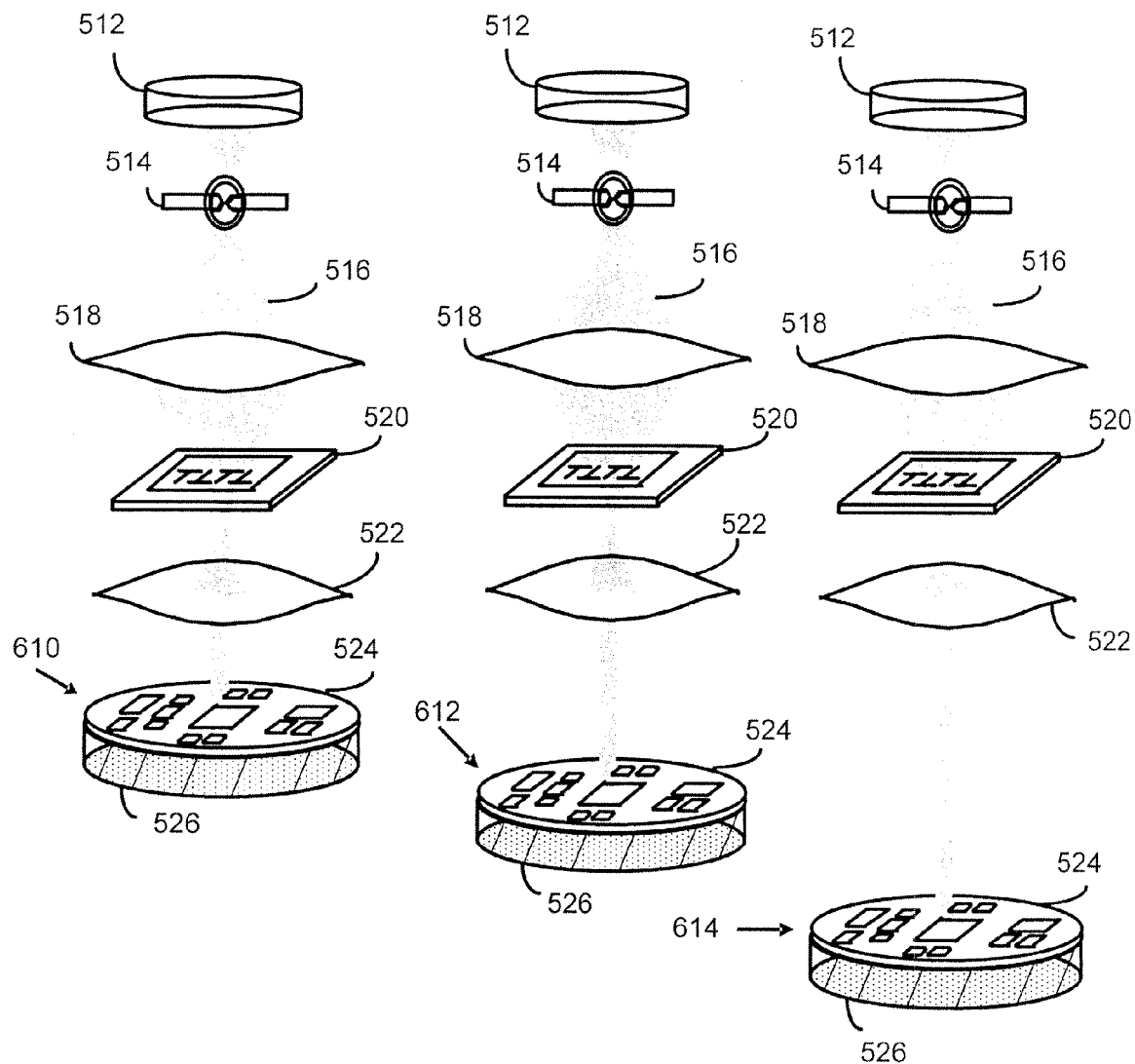
FIG. 6 is a diagram of an image sensor array being exposed at multiple focal planes in an exposure tool, according to one embodiment of the present invention.
Figure 7:
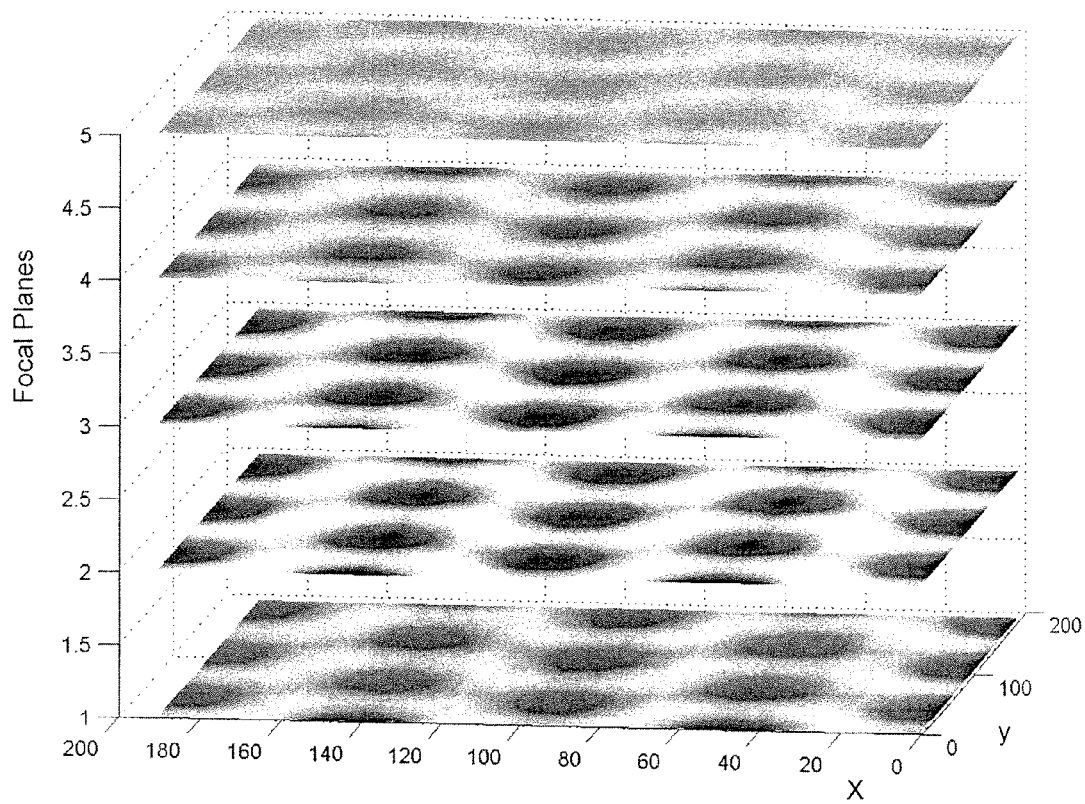
FIG. 7 is an example of measured image data through five focal planes, according to one embodiment of the present invention.

In one embodiment according to the present invention, sensor image data is collected by image sensor array 106 at several focus settings around an expected best focus position of an exposure tool. That is, the aerial image is sampled not only at the nominal focal plane of the exposure tool but also at positions above and below the nominal focal plane in order to generate a three-dimensional sample of the image intensity distribution through focus, e.g., within the depth of focus (DOF) of the exposure tool. Such sampling is generally accomplished by recording image patches at different focal planes around the focal plane of the expected best focus. For example, as shown in FIG. 6, image sensor unit 524 including image sensor array 106 is exposed at three different focal planes 610, 612, and 614, where focal plane 612 may be the focal plane of the expected best focus. FIG. 7 shows an example of image data that was collected using image sensor array 106 in a commercial exposure tool through focus, and with lateral (x and y) steps covering a square area of 1×1 um at each focus offset. What is shown in FIG. 7 are five image patches recorded by one single image sensor element of image sensor array 106 at five different focal planes.

There is no requirement that image sensor array 106 take measurements of (i.e., sample) an aerial image in a certain order. It would be possible to vary focus for each x-y offset first and then to perform a lateral step, or to collect complete patch data at each focus position, or to sample in any arbitrary sequence, as long as this sequence is known for image reconstruction. While complete two-dimensional image reconstructions are shown in FIG. 7, in some cases there is no actual need to reconstruct a complete, contiguous image, or even to perform the full two-dimensional sampling at each focus position. If sufficient information is available a priori on the pattern being imaged, it may be possible to optimize a sampling plan for specific pattern types in order to minimize the total time required for data acquisition. For example, if critical dimension measurements in a preferred direction are required, it may be sufficient to sample one or more one-dimensional cross-sections perpendicular to the feature orientation.

The sampling at each focus position needs to provide sufficient data in order to measure one or more suitable metrics of image quality that are expected to vary smoothly through focus and to have a maximum or minimum that allows one to identify or to define the best focus position. The example in FIG. 7 shows a clear variation of image contrast over the five different focal planes, with image contrast fading at the ends of the covered depth-of-focus range. Image contrast, (Imax−Imin)/(Imax+Imin), is a possible image quality metric to define the best focus; other measures could be image log slope (ILS, a common measure of lithography image quality), one or more line width measurements, or other parameters that can be extracted from the measured aerial image data. The image quality metrics may be derived from each complete patch or from specific sub-patches that may be predefined or determined during an additional intra-patch analysis step.

Figure 8:
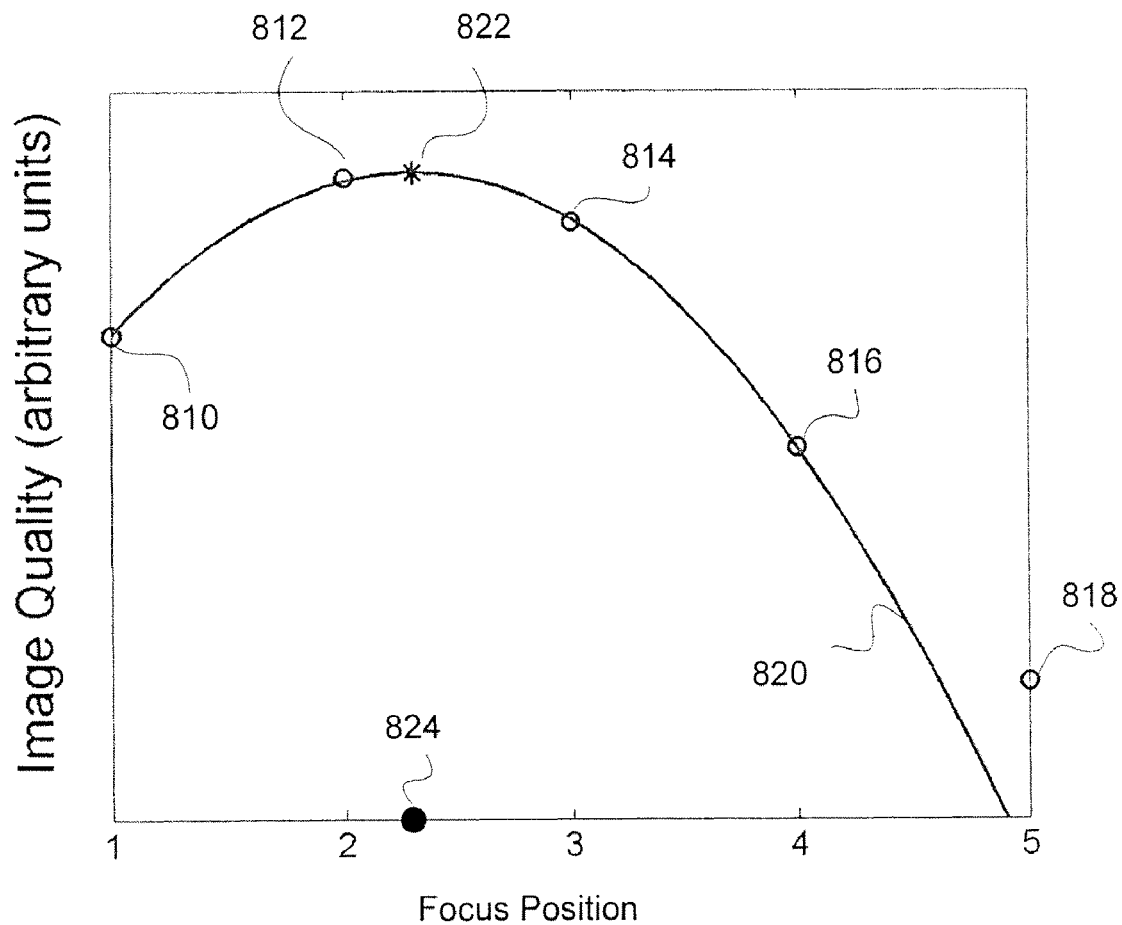
FIG. 8 is a function fitted to measured image quality metric data for determining a best focus, according to one embodiment of the present invention.

FIG. 8 illustrates a method of finding best focus from the discrete set of focus position data, according to one embodiment of the invention. The image quality metrics are plotted against focus positions (e.g., image quality metric data points 810-818), and a continuous function 820 is fitted to data points 810-816, e.g., by a least square minimization routine. The maximum value 822 of function 820 is determined to be the value for the image quality metric at best focus, and the focus position that corresponds to data point 822 is the best focus 824. A variety of function types may be used for fitting, and a variety of fitting algorithms may be utilized. Also, a best function that reproduces most accurately the actual shape of the through-focus variation may be determined in an optional calibration step. As examples, the fitting function may be a parameterized function such as a polynomial of various degrees (e.g., a $2^{nd}$ order or $3^{rd}$ order polynomial with respect to the focus value), a Gaussian function, a Fourier series, a first-principles model, or a look-up table generated by simulation or calibration measurements. In the embodiment shown in FIG. 8, a $2^{nd}$ order polynomial was fit to only the four data points 810-816 closest to the maximum image quality metric value, and function 820 provides a good fit for data points 810-816. In another embodiment, a physics-based function of the through-focus variation can be used instead of a simple polynomial. Such a function can be expected to provide better agreement for data point 818 at the $5^{th}$ focus position, and may generally provide a more robust and accurate determination of best focus 824. Also, there may exist some finite offset between the maximum or minimum of the fitted function, and some alternative method of finding best focus 824 can be used, e.g., if the data captured by image sensor array 106 is used to predict resist contours by an additional resist model; such offsets may be determined from an additional calibration step as well.

Figure 9A:
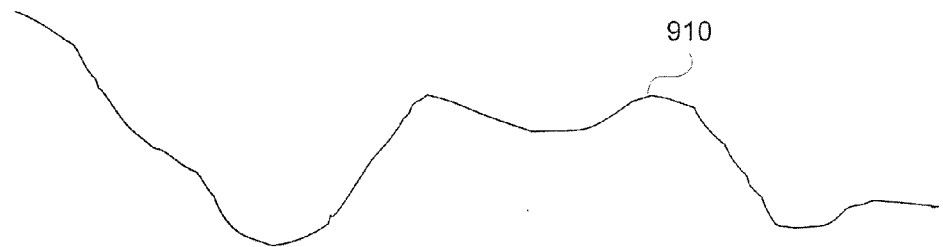
FIG. 9A is a diagram of a cross-section of an image sensor array with local height variations, according to one embodiment of the present invention.
Figure 9B:
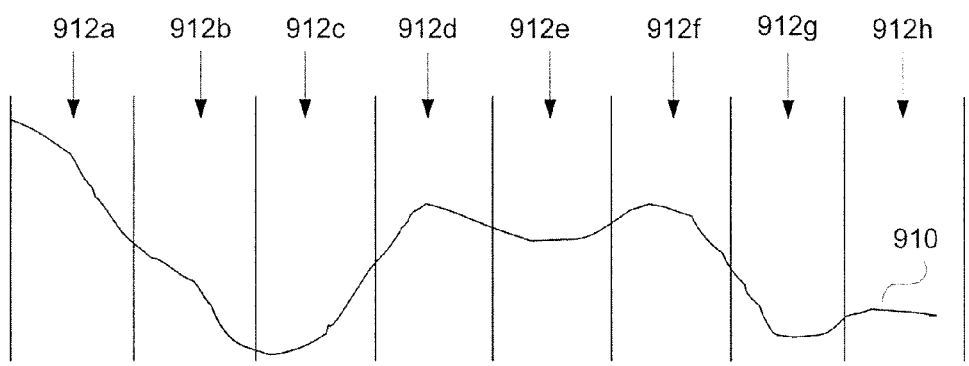
FIG. 9B is a diagram of the cross-section of the same image sensor array shown in FIG. 9A, where the image sensor array is segmented to show locations of the different active elements on the image sensor array, according to one embodiment of the present invention.
Figure 9C:
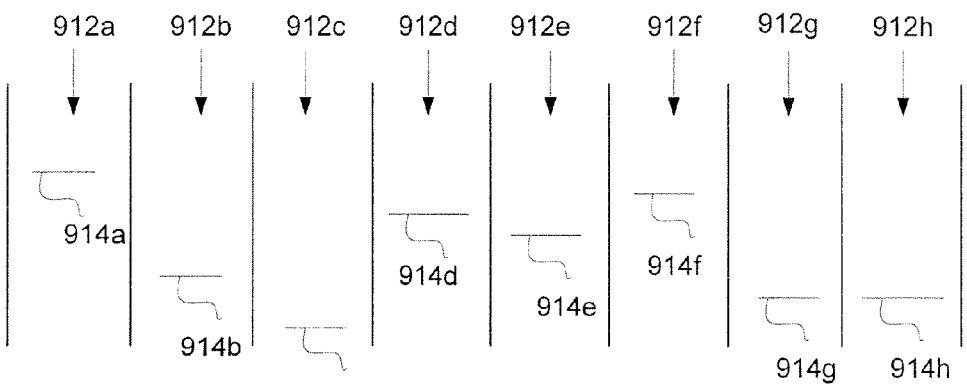
FIG. 9C is a diagram of the effective average height of each image sensor element of the image sensor array of FIG. 9A, according to one embodiment of the present invention.

FIGS. 9A-9C illustrate the problem of non-flatness of a non-ideal image sensor array 106. As a result of this non-flatness, each image sensor element 200 of image sensor array 106 is at a slightly different height relative to the focal plane of the exposure tool. FIG. 9A is a diagram of a cross-section 910 of image sensor array 106 including multiple image sensor elements 200 with local height variations. FIG. 9B shows the same cross-section 910 segmented according to different locations 912 of image sensor elements 200 on image sensor array 106, where the active area of each image sensor element 200 may be much smaller than the full spatial extent of image sensor element 200. FIG. 9C shows the effective average heights 914 of different image sensor elements.

Figure 10:
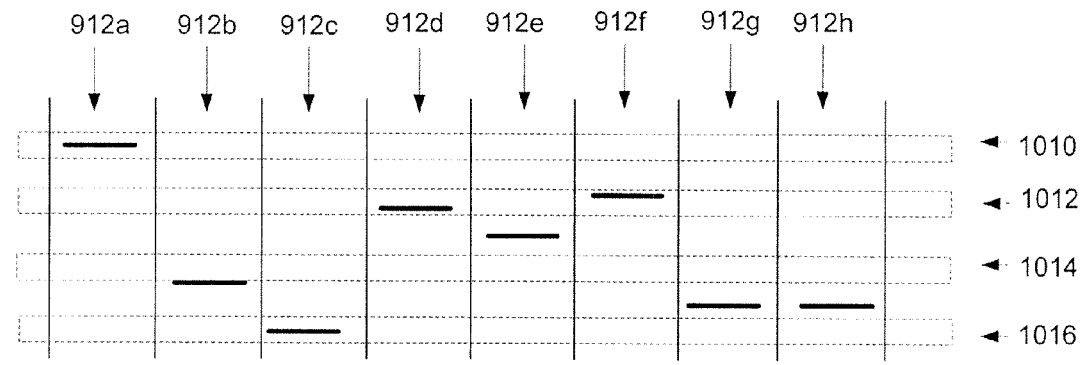
FIG. 10 is a diagram of multiple exposures, each at a different focal plane, captured by an image sensor array with local surface non-flatness, according to one embodiment of the present invention.
Figure 11:
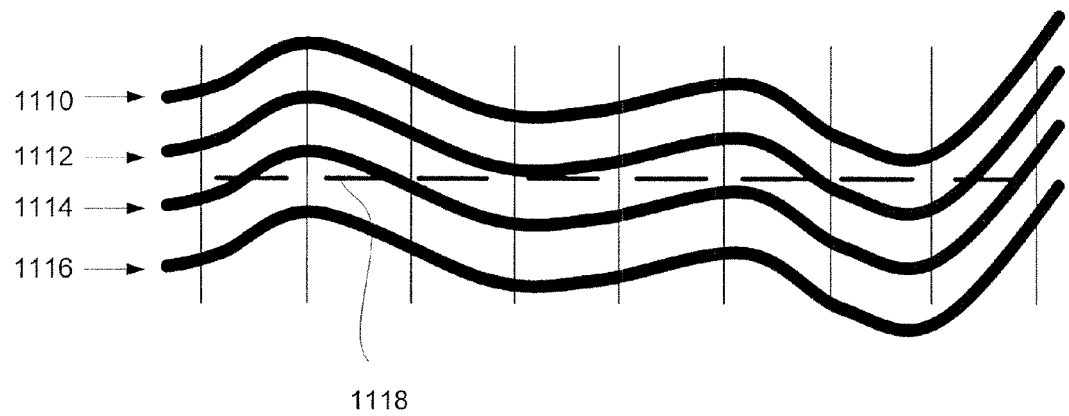
FIG. 11 is a diagram of multiple exposures, each at a different focal plane, captured by an idealized, perfectly flat image sensor array but with exposure tool-related focal plane distortions, according to one embodiment of the present invention.

FIG. 10 is a diagram of one embodiment of multiple exposures, each at a different focal plane, captured by image sensor array 106 with local surface non-flatness. FIG. 10 shows measurements at four different focal planes 1010-1016, i.e., focus positions, in such a way that the complete range of image sensor element height variations is covered by the measured data at the four different focal planes 1010-1016. Each image sensor element of image sensor array 106 has a best focus position that is at or near one of focal planes 1010-1016. Measuring an aerial image at each of focal planes 1010-1016 allows the best focus position for each individual image sensor element of image sensor array 106 to be determined. In FIG. 10, it is implied that the focal plane of the exposure tool is almost perfectly planar, while the surface of image sensor array 106 has certain non-flat topography. FIG. 11 shows the opposite situation, where the image sensor elements of image sensor array 106 lie in a single plane 1118 but the focal planes 1110-1116 in the exposure tool are non-planar.

In either case, by measuring the best focus for each individual image sensor element in image sensor array 106, a two-dimensional focus map can be constructed to indicate the difference between the measured best focus and the nominal best focus setting for each individual image sensor element. In the situation shown in FIG. 10, the focus map will exactly represent the topography of the surface of image sensor array 106, while in the other extreme case shown in FIG. 11, the focus map will be an accurate representation of the exposure tool's actual focal plane distortions. In many realistic cases, contributions from both image sensor array 106 and the exposure tool will combine into a measured, effective focus map.

Many modern exposure tools have "dynamic" focus tracking systems or built-in metrology tools to map the exposure field and may use algorithms to follow this measured topography by dynamic focal plane adjustments during the scan. Alternatively, "static" or "stepper mode" focus leveling may be available, where a single target focus plane is fitted over the complete exposure field. If non-flatness of image sensor array 106 is a concern and intrinsic focal plane distortions of the exposure tool are sufficiently small, a preferred mode of operating the exposure tool would be to use the "static" focus leveling in order to extract more directly the actual topography of image sensor array 106. Nevertheless, the embodiments for creating a focus map disclosed herein can be applied to dynamic focus tracking as well.

In the general case, i.e., if the effective focus map has contributions from both image sensor array 106 and the exposure tool, these contributions may be distinguished and separated by external calibration or self-calibration routines. External calibration of a topography map of image sensor array 106 with sub-nanometer precision may be achieved with a number of test instruments using, in particular, imaging interferometric methods such as white-light scanning or phase-shifting interferometer or Fizeau interferometers. Alternatively, the surface of image sensor array 106 may be scanned—with image sensor array 106 on a flat chuck—by a scanning height level gauge, similar to the level sensors in an exposure tool. As most exposure tools normally measure the topography of the exposure field, this information may also be extracted from the exposure tool itself. Correspondingly, intrinsic focal plane distortions may be mapped out by built-in self metrology of the exposure tool.

If a reliable external calibration is not available, self-calibration procedures similar to methods previously described in the literature can be applied (see e.g., U.S. Pat. No. 5,798, 947 and http://selfcalibration.interconnect.com/, the disclosures of which are hereby incorporated by reference). These procedures will generally involve taking data at different orientations of image sensor array 106, e.g., with image sensor array 106 rotated by multiples of 90 degrees, or at different position offsets, in order to distinguish signal contributions that are static under these transformations (i.e., the exposure tool related signal), and contributions that follow the translation or rotation (i.e., the contribution related to image sensor array 106). This basic principle is shown in FIGS. 12A-13C.

In one embodiment, image sensor array 106 could be rotated by a multiple or multiples of 90 degrees and exposed as a function of focus. The computed focus maps from these alternate orientations can be compared to a focus map at the normal orientation. Any focal plane deviation that follows the rotation of image sensor array 106 can be uniquely determined as arising from non-flatness of image sensor array 106; any focal plane variation that remains invariant with respect to the exposure tool can be uniquely determined as being due to non-flatness of the focal plane of the exposure tool.

FIGS. 12A and 12B show two images collected with image sensor array 106 rotated 90 degrees between exposures. The measured non-flatness is represented by the contours with an arbitrary scale. Because the contour patterns are identical in both exposures except for following the rotation of image sensor array 106, the non-uniformity in the focal plane must have resulted from image sensor array 106. Similarly, FIGS. 13A and 13B show two images collected with image sensor array 106 rotated 90 degrees between exposures. The measured non-flatness is represented by the contours with an arbitrary scale. Because the patterns are not identical in both exposures, the non-uniformity in the focal plane must have at least in part resulted from the exposure tool. FIG. 13C is a difference map showing the image in FIG. 13B subtracted from the image in FIG. 13A. The linear orientation of FIG. 13C indicates that the focal plane non-flatness is due to a linear tilt in the focal plane of the exposure tool. In view of the images shown in FIGS. 12A-13C, a method for creating a focus map may include taking data at various orientations and positions of image sensor array 106 in order to self-calibrate the sensor surface topography by suitable algorithms.

Using calibration information, generally separate focus maps can be constructed that reflect only the topography of image sensor array 106 or only the focal plane distortions of the exposure tool. By using these focus maps in the image data analysis described below, contributions from the exposure tool, image sensor array 106, and the mask can be reliably separated. Such separation can be achieved in, for example, critical dimension uniformity measurements to characterize most accurately the lithography process conditions. From this optimized characterization, accurate and robust correction adjustments can be derived for optimal process control.

Figure 1:
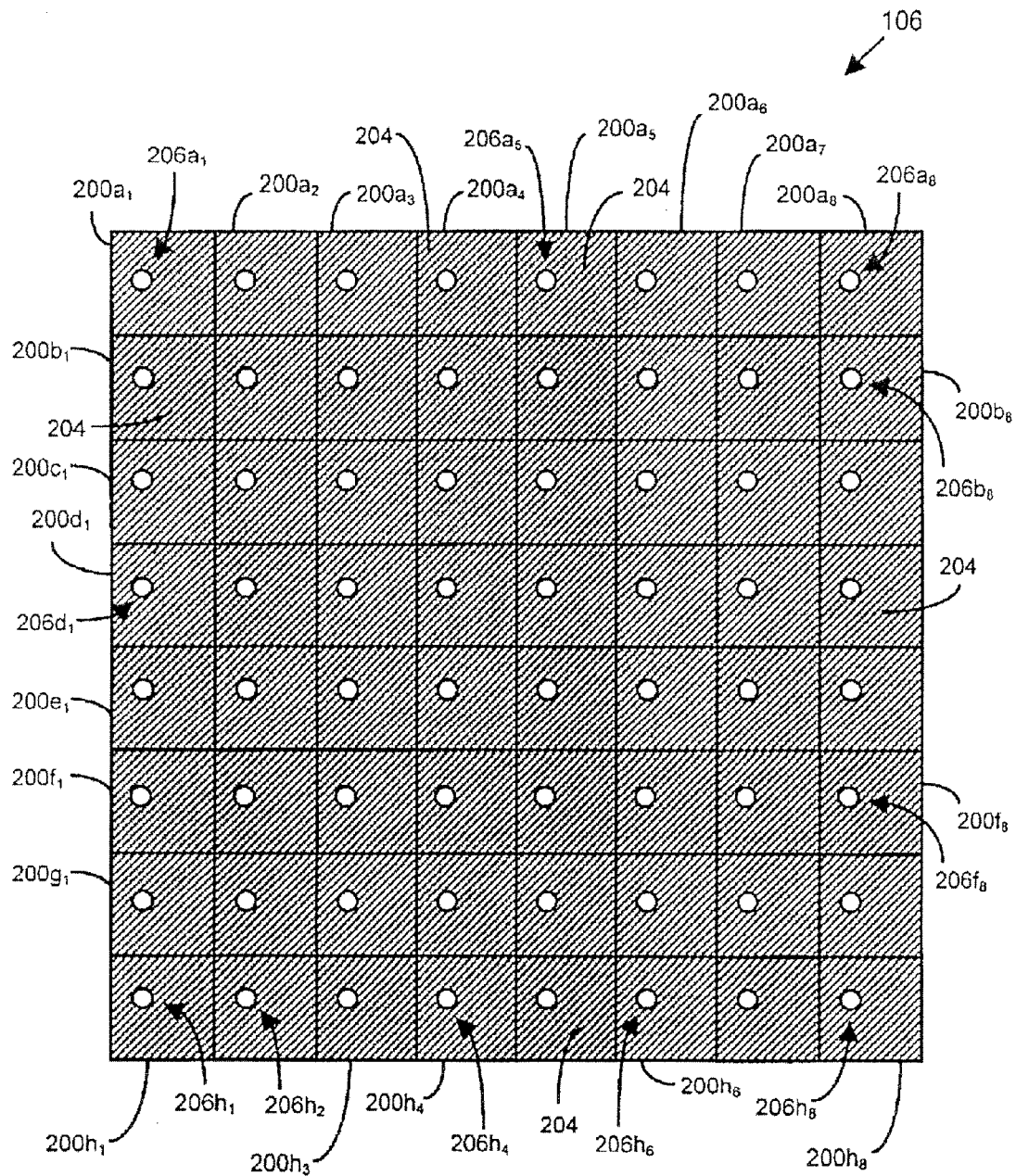
FIG. 1 is a diagram of a prior art image sensor array.
Figure 2:
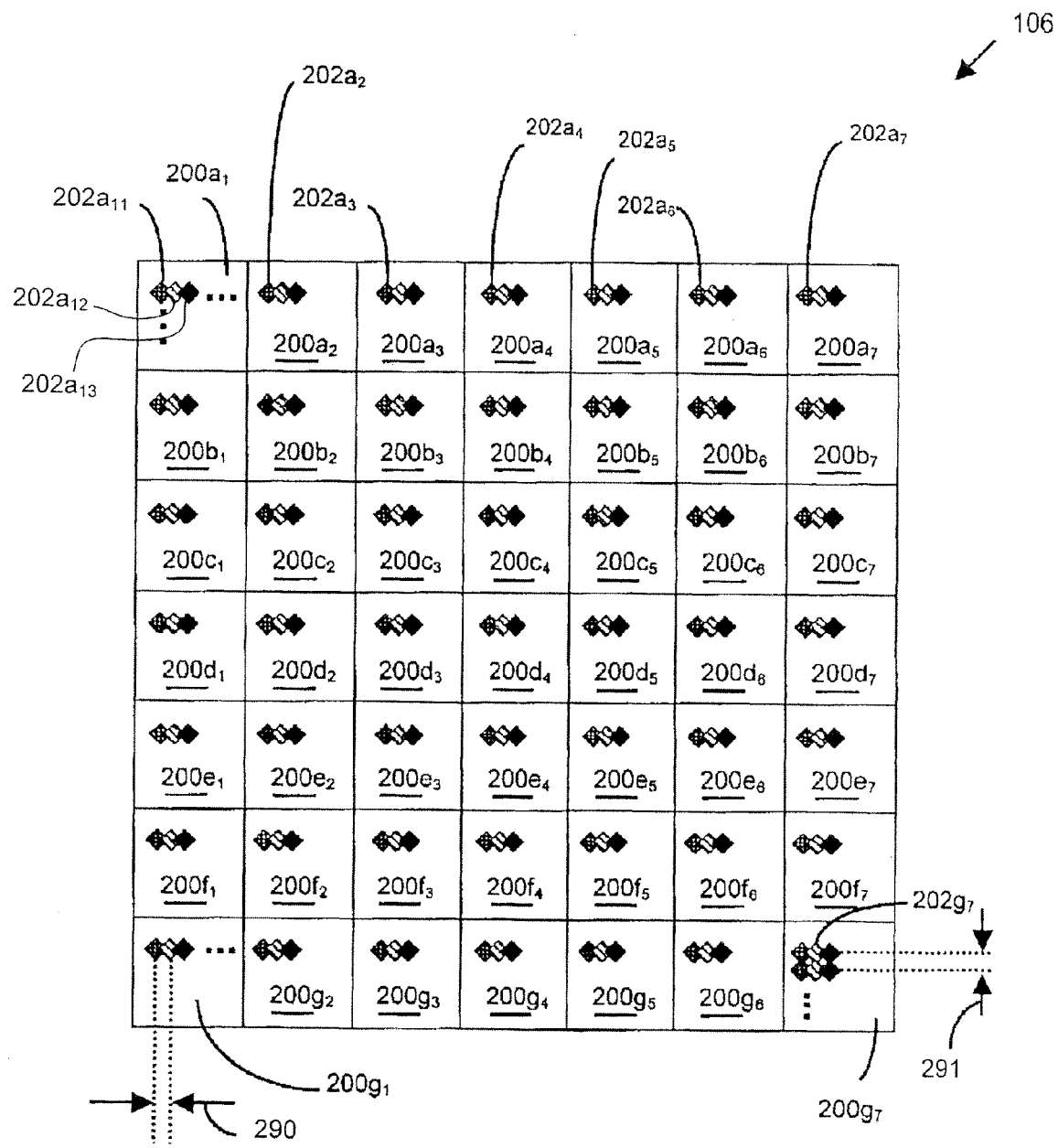
FIG. 2 is an illustration of multiple exposures of the prior art image sensor array of FIG. 1.
Figure 3A:
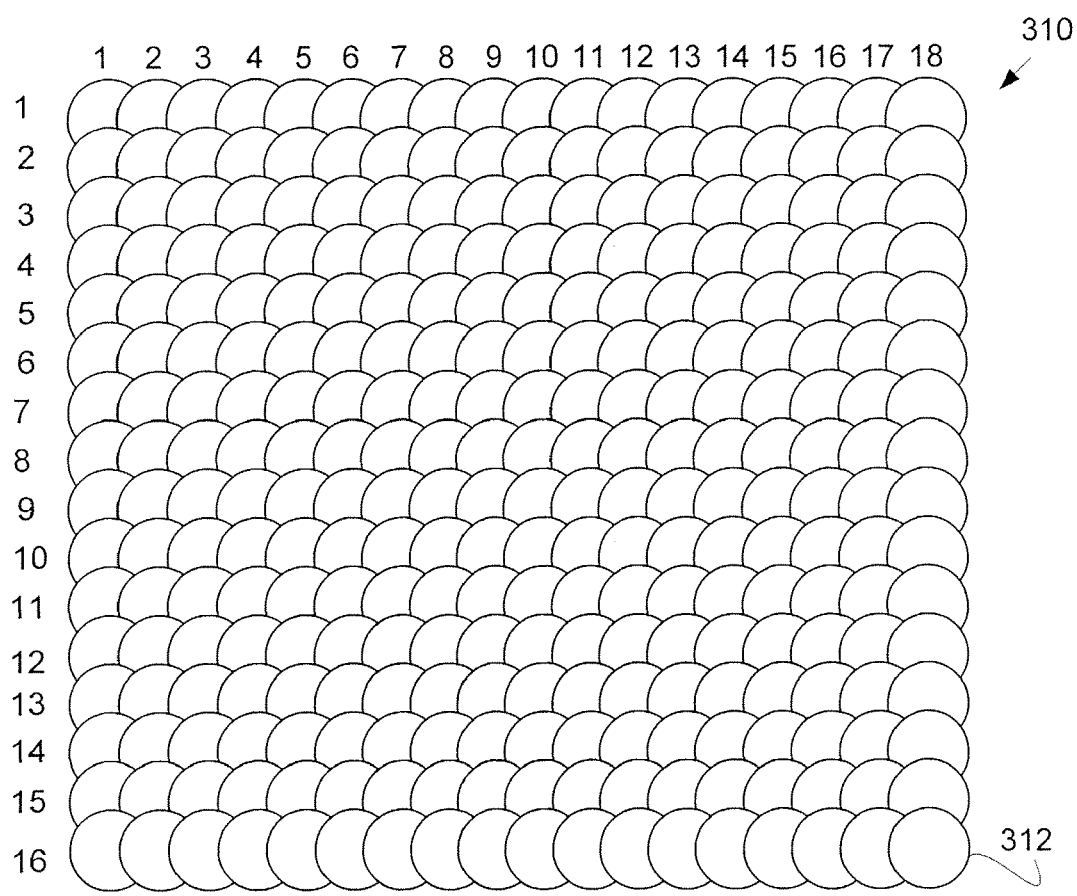
FIG. 3A is a diagram of a single image patch composed of 16×18 overlapping exposures of a single aperture of the prior art image sensor array of FIG. 1.
Figure 3B:
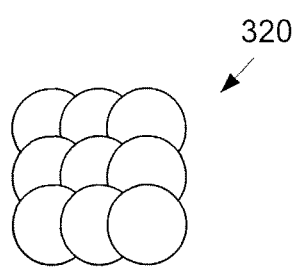
FIG. 3B is a detail view of a three-by-three array, a "subpatch," within the larger image patch of FIG. 3A.
Figure 4:
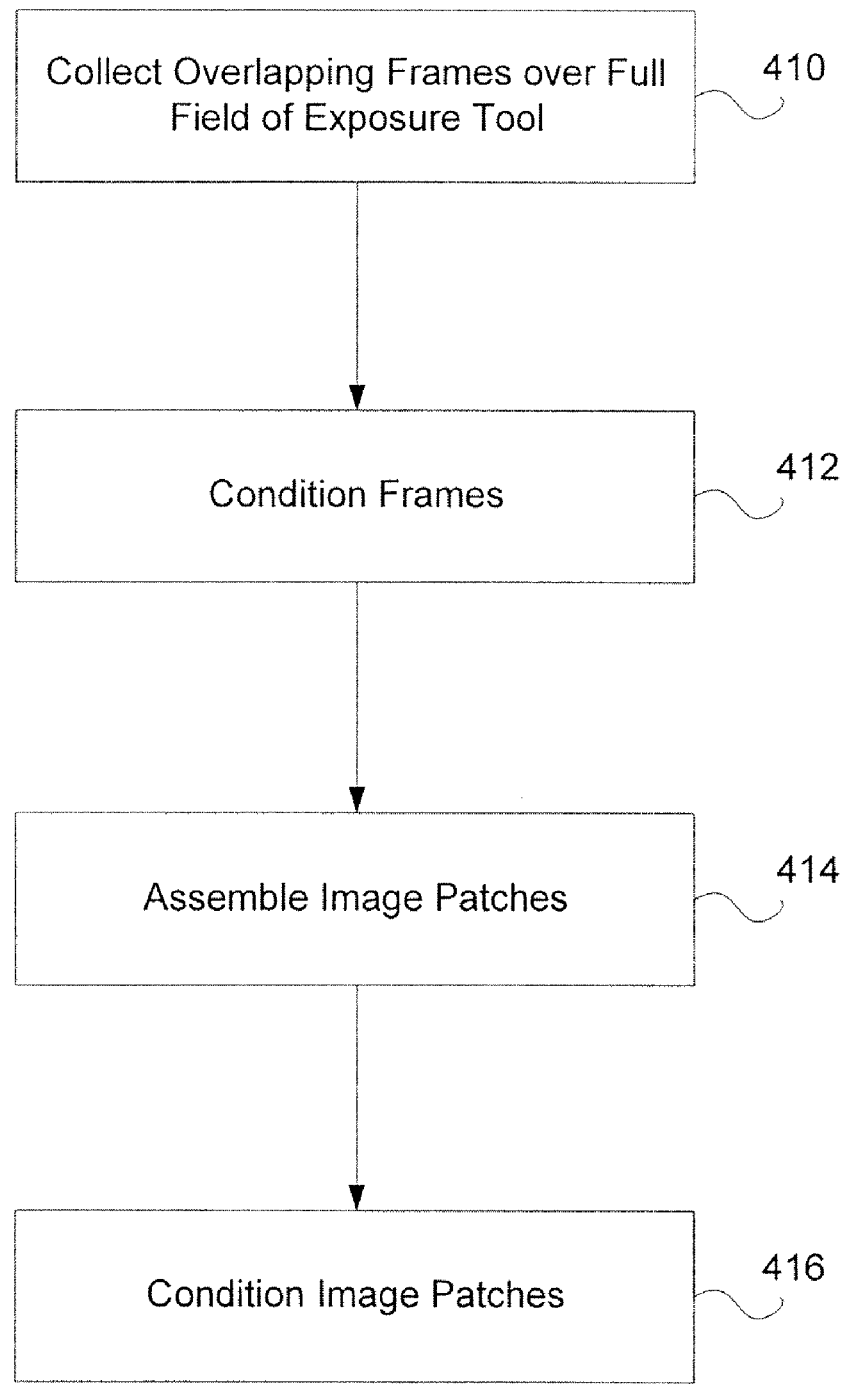
FIG. 4 is a flowchart of method steps for image formation using the prior art image sensor array of FIG. 1.
Figure 5:
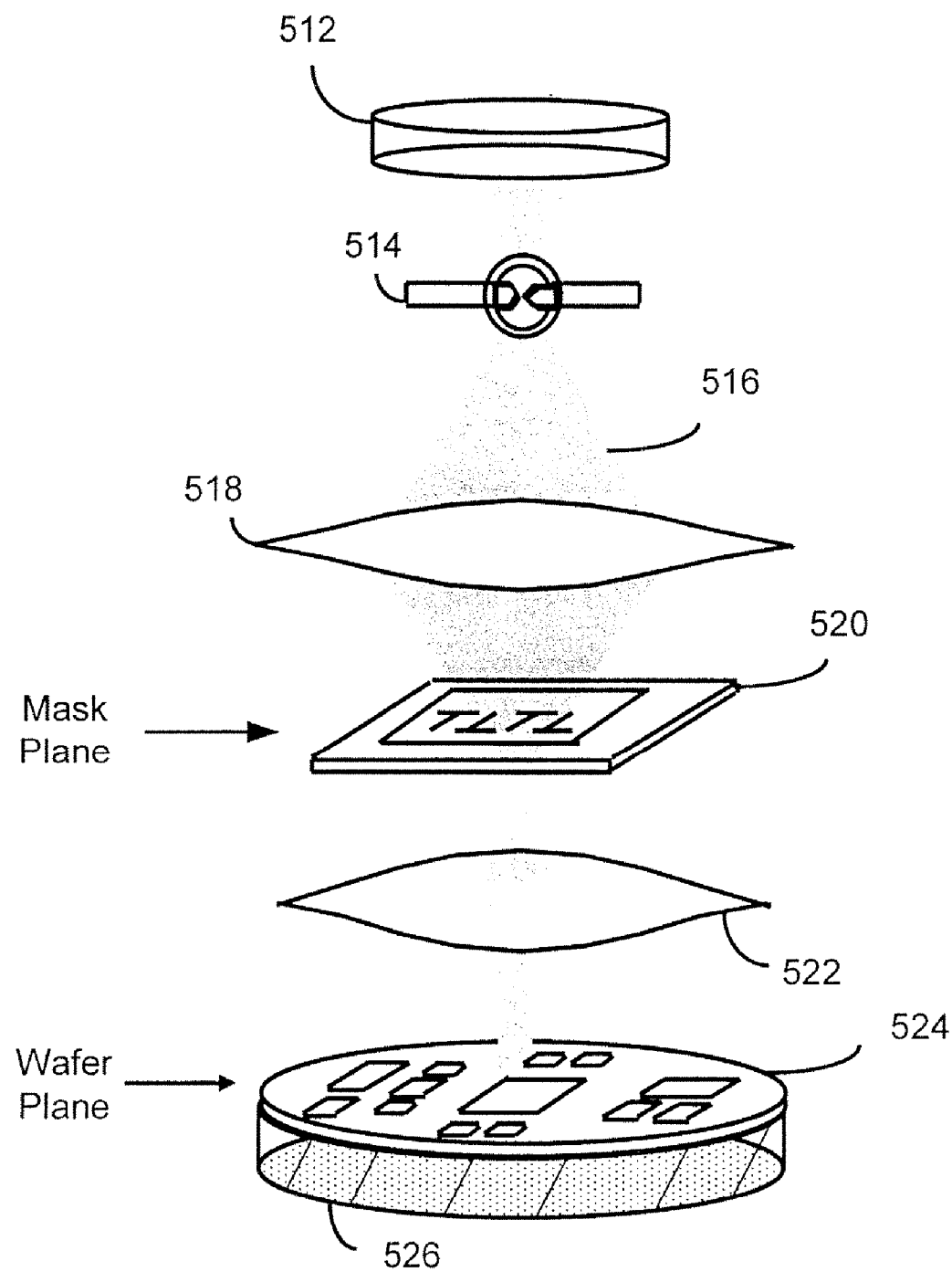
FIG. 5 is a diagram of the prior art image sensor array of FIG. 1 being exposed at a given focus within an exposure tool.

The area of a patch has so far been assumed to be relatively small such that the focus or height variations within a patch can be neglected. If the patch becomes very large, however, this assumption may not be valid anymore. In that case, it is straightforward to extend the described method by logically separating large patches into smaller sub-patches (as shown in FIG. 3B) and perform the same focal plane analysis on the set of sub-patches. The best focus may even be determined locally for every single sampling location, i.e., for every single pixel within a patch, by fitting image quality through focus for a sub-patch centered on the particular pixel under consideration.

The size of the sub-patches as shown in FIG. 3B may be fixed at a preset value for all patches, may be varied for each patch based on the expected image pattern within that patch, or may be varied dynamically depending on the measured image quality metrics within the patch. Also, the number of sub-patches chosen to locate the optimum focus for the entire patch may be fixed at a preset value for all patches, may be varied for each patch based on the expected image pattern within that patch, or may be varied dynamically depending on the measured image quality metrics or the variation in the measured image quality metrics within the patch.

The best focus position for the entire patch may be determined from the selected set of sub-patches by finding the best focus for each sub-patch and then averaging the individual values, by performing a weighted average of the individual values where the weighting factor is a measure of the goodness of fit for each sub-patch, or by computing the statistical distribution of individual values and computing the mean of the distribution. Tilt or curvature of each patch may also be determined by fitting appropriate parametric functions to the focus map of the best focus for each sub-patch vs. position within the patch. Fliers (points that are statistically different than the rest of the distribution) may be excluded before any of these calculations are performed. Alternatively, the image quality metric data vs. focus from each sub-patch may be averaged to derive a global metric for each focus position, and then a single parametric function of this composite metric vs. focus may be fit to determine the best focus for the patch. Flier removal and weighting can also be conducted in the calculation of the composite value for each focus setting.

Returning to FIG. 8, the actual point of the best focus may not necessarily be at the maximum of function 820 of image quality metric vs. focus position. Some offsets may be determined, either globally, on a point-by-point basis, or on the basis of the feature type being imaged. These offsets would then be stored and applied during data fitting, determining best focus, and process correction.

The focal plane of the exposure tool has so far been assumed to be a unique, static entity; however, this is an oversimplification since the "best focus" for a projected pattern may depend on many factors. The ability to map out the real or effective focal plane using image sensor array 106 enables detection of such factors, monitoring of focal plane variations over time, or adjustments made to the exposure tool as a result.

As an example, image sensor array 106 may monitor the consistency of the exposure tool focus leveling over time, e.g., by routine inspections on a regular schedule. This method would detect and record overall drifts in focal plane offset or tilt, as well as any changes in the focal plane shape against a baseline measurement or a historic average. Such changes may occur from general drifts of the exposure tool electronics or from changes to the optics column due to short-term effects such as barometric pressure and temperature (e.g., due to lens heating) variations, or long-term effects such as aging of the lens materials. Besides focus offsets and tilt, the curvature of the focal plane may be actively adjustable in high-end exposure tools, and the performance and accuracy of any such adjustments may be verified very efficiently with image sensor array 106 collecting a large amount of data across the complete exposure field.

Furthermore, certain aberrations of the projection lens affect the best focus position and lead to a pattern dependence of best focus offset: astigmatism leads to a shift in best focus between horizontal and vertical (or orthogonally diagonal) patterns; spherical aberration leads to a dependence of best focus as a function of pitch on line-space patterns. Both these aberrations can have a significant negative impact on lithography performance, and will generally vary over time. Image sensor array 106 and the focal plane mapping techniques described herein allow such focal plane variations to be characterized in detail and monitored over time. From such measurements, adjustments to the projection optics of the exposure tool may also be derived. A possible implementation could use a test/monitor reticle with a variety of test structures, such as line-space with varying pitches and varying orientations, e.g. 4 rotations of 45 degrees. Due to the very large number of available sampling locations, and the generally slowly varying nature of the aberrations within the exposure field, a complete and simultaneous mapping of e.g., astigmatism or spherical aberration effects can be accomplished by a single run of image sensor array 106 in the exposure tool.

In a similar manner, by separating the focal plane nonflatness into contributions due to image sensor array 106 topography and those due to the focal plane characteristics of the exposure tool, maps of image sensor array 106 topography can be reconstructed from the data and monitored for changes or signs of degradation of image sensor array 106 due to age, physical or thermal stress, or handling issues. Such monitoring could be implemented automatically as part of the routine data analysis and used to provide early warning of impending failure or unacceptable drift of the operating characteristics of image sensor array 106. The data could be tracked on an average global basis across image sensor array 106, on an aperture by aperture basis, or even on a pixel by pixel basis to check for signs of foreign material or other deformations between the individual apertures 206.

A prominent application of image sensor array 106 based metrology will be for example in critical dimension uniformity characterization of the lithography process. As discussed above, it is undesirable to have any influence of the topography of image sensor array 106 on such critical dimension uniformity measurements. Depending on the exact purpose of the application, it may or may not be desirable to include the exposure tool effects in a critical dimension uniformity map. The objective may be qualification or verification of a reticle independent of any exposure tool effects, or it may be process control, in which case the performance of the complete imaging process including mask and optics needs to be characterized.

One aspect of the invention is the generation of aerial image data and parameters derived from the aerial image data, such as the critical dimension uniformity, at any position within the focal range covered by the data acquisition by using the data measured by image sensor array 106 as input to an interpolation process. This interpolation may be purely numerical or it may involve a physical model that is fitted to the measured through-focus data.

Figure 14A:
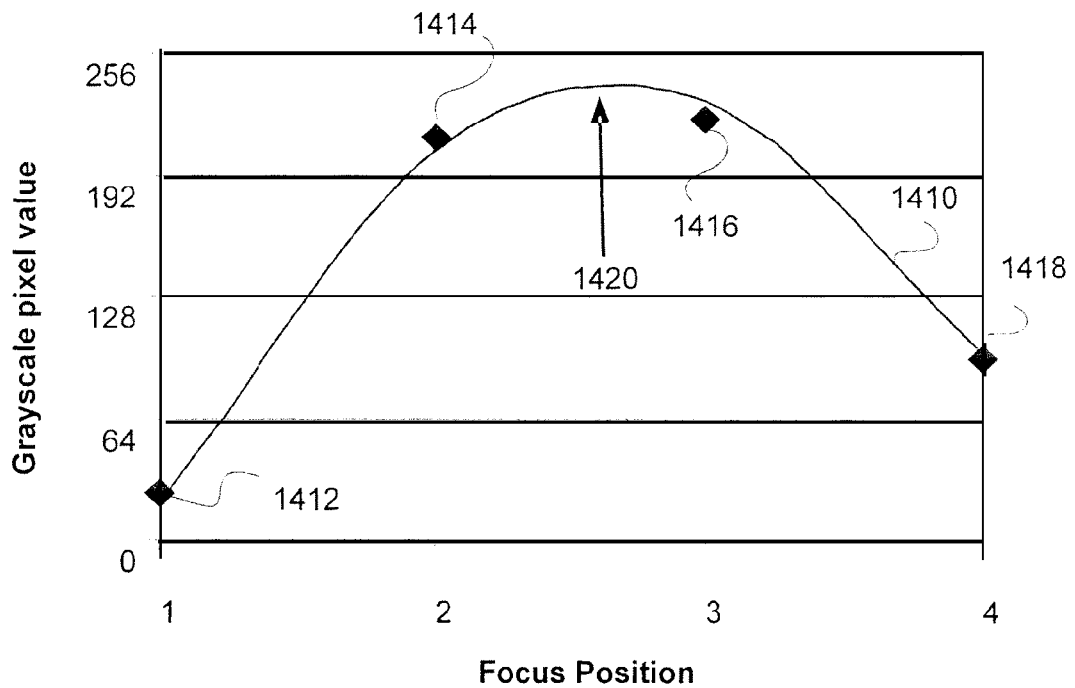
FIG. 14A shows a function fitted to measured image intensity data for a single pixel of an aerial image used in the generation of a reconstructed image at the best focus, according to one embodiment of the present invention.

A simple example is the generation of reconstructed images at the best focus for each image sensor element 200 of image sensor array 106, which is illustrated in FIG. 14A. As an example only, a pixel-wise interpolation is performed for each x-y location (i.e., each pixel) within each sampled patch by fitting a smooth function 1410 to measured image intensity values 1412-1418 through focus. Since the best focus position is known for each patch location from the focus map, the expected image intensity value 1420 at that exact focus setting can then be derived from function 1410. Doing so for each pixel within each patch results in a set of reconstructed patches that indicate the projected image at the best focus for every patch location within the exposure field. The set of patches at the local best focus constructed in this way will reflect across-field image quality independent of focus variations due to either the exposure tool or the topography of image sensor array 106. If the effect of exposure tool focal plane distortions is to be included in across-field analysis, e.g., critical dimension uniformity, the exposure tool focus map can be separated from the topography of image sensor array 106 in the effective focus map, and be applied as a simple offset to the local best focus position in the image interpolation process.

Figure 14B:
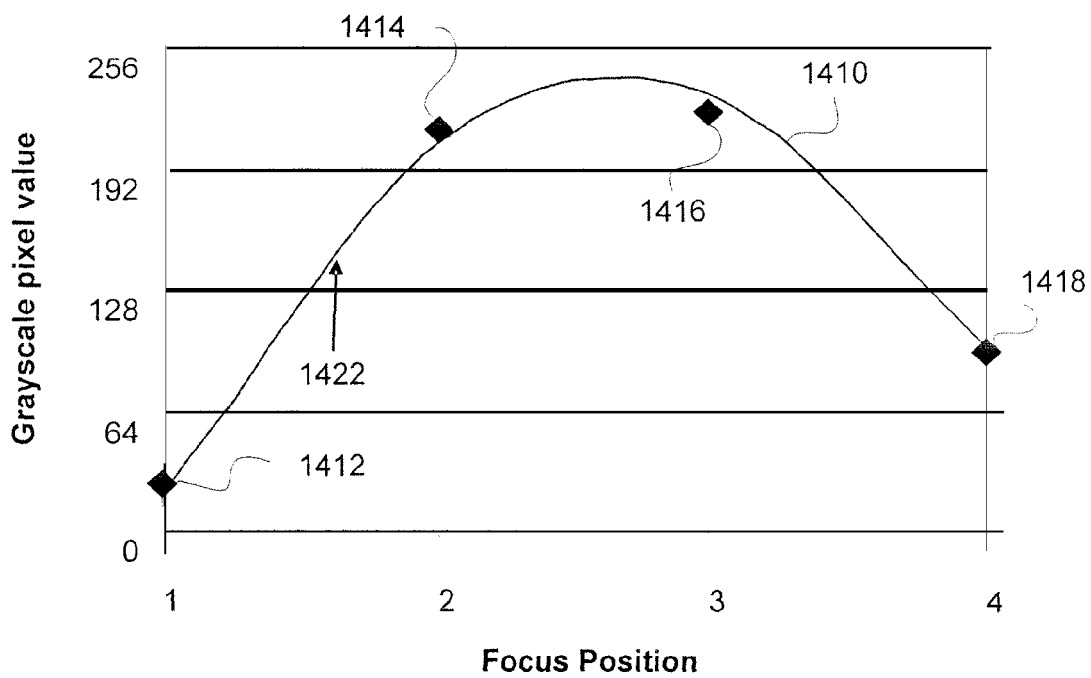
FIG. 14B shows a function fitted to measured image intensity data for a single pixel of an aerial image used in the generation of a reconstructed image at a fixed distance from the best focus, according to one embodiment of the present invention.

As shown in FIG. 14B, more generally, image patch data can be reconstructed by interpolation at any arbitrary offset 1422 from the best focus within the defocus range covered by the measured data. Therefore, it is possible to measure through focus variations of line-widths or other parameters at all patch locations and at equal, pre-determined defocus values. A characteristic property of image sensor array 106, as opposed to the resist, is its linear response to exposure light. Therefore, image properties at different exposure doses can be derived from a single image obtained from image sensor array 106 by simple mathematical scaling of the image values before, e.g., applying a resist model or other data analysis.

This method of dose scaling and through-focus image reconstruction allows for the complete and accurate mapping of the process window for any of the sampled pattern areas of the mask. By applying local defocus offsets from an exposure tool focus map, the common process window for all patterns across the exposure field can be accurately determined. Based on such process window analysis, optimization of process conditions may be calculated and directly fed back as corrections to improve process control or alternatively be provided to an existing statistical process control system. Furthermore, monitoring the process window over time may not only detect any drifts in the lithography projection process but also provide a predictive and proactive measurement of the severity of such drifts for device production.

In the above examples shown in FIGS. 14A and 14B, a separate per-pixel interpolation using a function fit was assumed to generate the pixel intensity value at the interpolated focus positions. Other methods of interpolation may be used, such as direct linear interpolation or a spline interpolation; if function fitting is used, the function may be analytical, parameterized, or derived from an empirical or detailed, first-principles model. Also, more complex, multidimensional interpolation or fitting may be used. In addition, noise filtering or other data pre-processing may be performed before the interpolation, in order to correct for noise or errors on the measured data. For example, if there are overlay shifts or other misalignment between the measured patches, these could be compensated for by mutual sub-pixel alignment of the raw patches, based on image processing algorithms.

Figure 15:
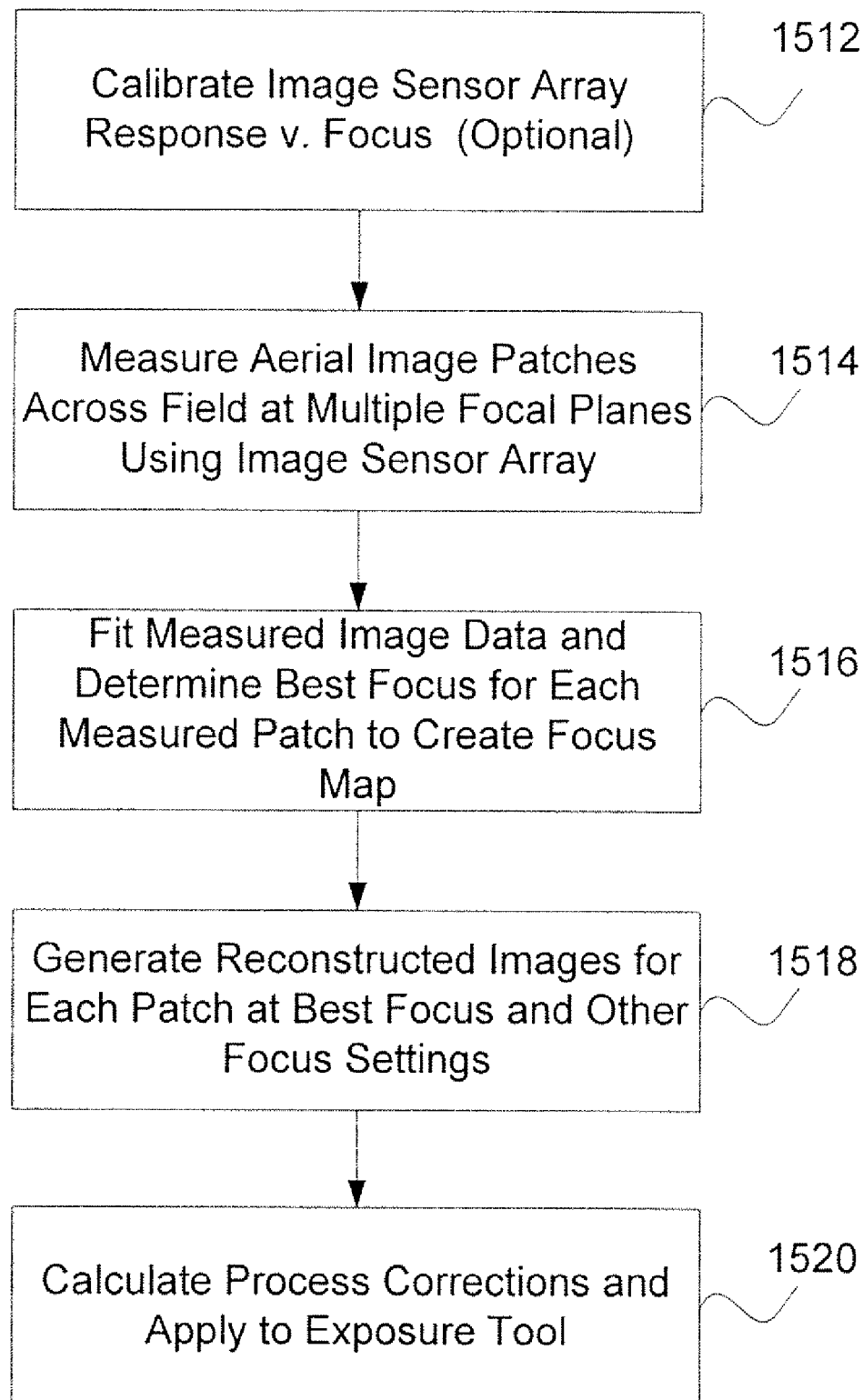
FIG. 15 is a flowchart of the method steps for focus correction in an exposure tool, according to one embodiment of the present invention.

FIG. 15 is a flowchart of method steps for correcting focus in an exposure tool, according to one embodiment of the invention. In optional step 1512, the response of image sensor array 106 versus focus is calibrated by selecting an appropriate function to fit to data measured by image sensor array 106. Step 1512 is discussed further below in conjunction with FIG. 16. In step 1514, aerial image patches across the field of the exposure tool are measured at multiple focal planes using image sensor array 106. In step 1516, a best focus for each measured patch is determined by fitting a function to image quality metrics determined for each measured patch. The differences between the best focus positions for each patch and a nominal best focus position for the exposure tool are compiled into a focus map. Step 1516 is further discussed below in conjunction with FIG. 17. In step 1518, a reconstructed image for each patch at best focus and other focus settings is generated from the function that was fitted to the measured image quality metric data. Step 1518 is further discussed below in conjunction with FIG. 18. In step 1520, process corrections are calculated and applied to the exposure tool. Step 1520 is further discussed below in conjunction with FIG. 19.

Figure 16:
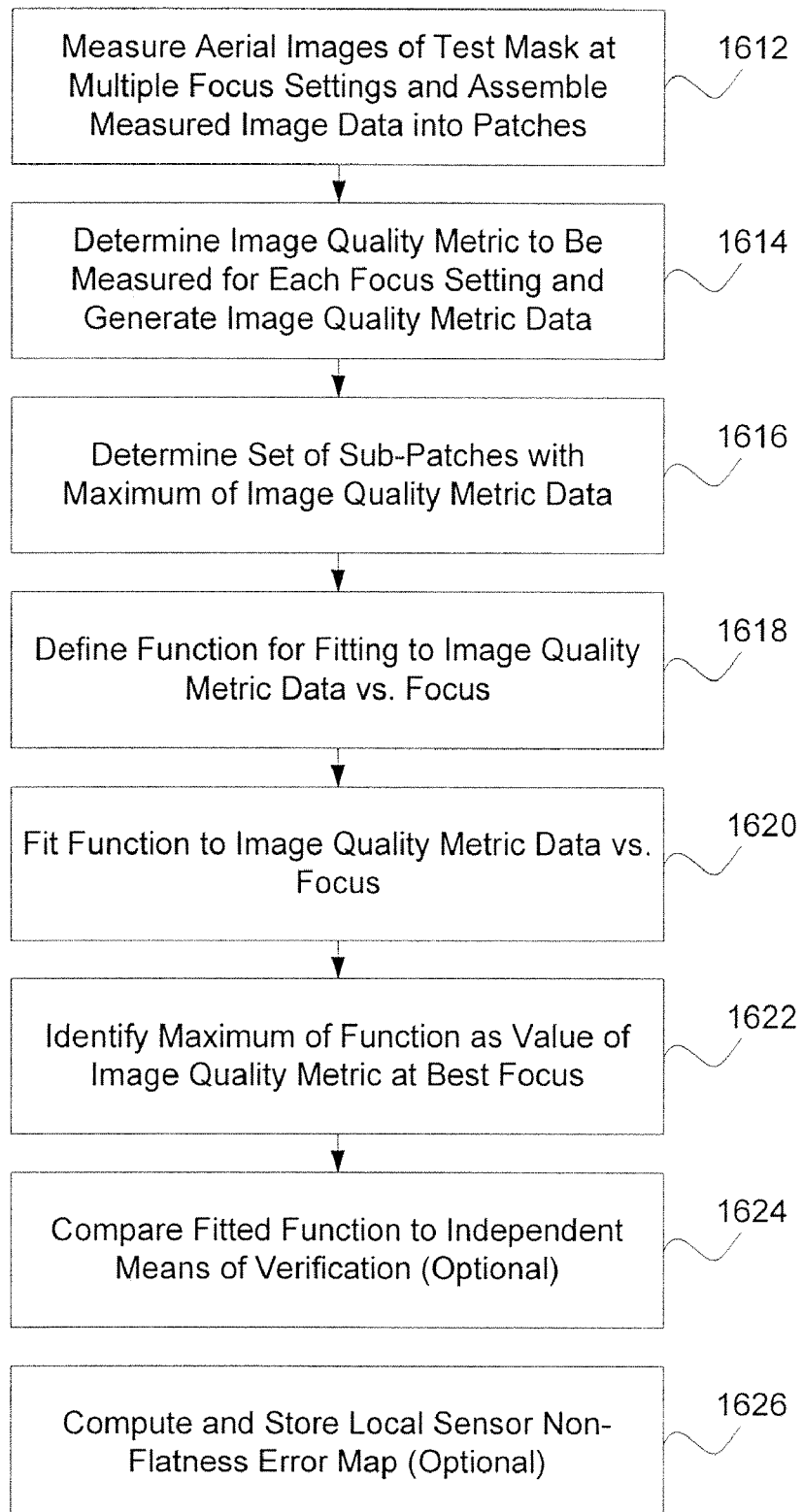
FIG. 16 is a flowchart of method steps for implementing an optional calibration step of FIG. 15, according to one embodiment of the present invention.

FIG. 16 is a flowchart of method steps for implementing optional calibration step 1512 of FIG. 15 to select a function to fit to measured aerial image data, according to one embodiment of the invention. In step 1612, a series of aerial images of a test mask are measured at different focal planes of an exposure tool using image sensor array 106 and the multiple overlapping images produced by lateral exposures of each image sensor element 200 of image sensor array 106 are assembled into patches at each focus setting. In step 1614, an image quality metric for each measured patch at each focus setting is selected and image quality metric data for each patch is generated. In step 1616, a set of sub-patches with the maximum image quality metric data is determined. The size of the sub-patches may be preset or dynamically determined based on the patch size and the distribution of the image quality data. In step 1618, a function is defined for fitting the image quality metric data at each focus setting. In step 1620, the selected function is fit to the image quality metric data for each patch at the focal planes. In step 1622, the maximum of the fitted function is identified and the focus position for that point is determined to be the best focus position for that patch. The determined best focus positions of all patches across the entire image sensor array form the best focus map of image sensor array 106 to be employed in future calibration. In optional step 1624, in order to verify the fitted function selection and the fitting accuracy, the fitted image quality metric data is compared to independent verification data, for example, the measurements of the resist images of the test patterns or simulations of the image quality metric data based upon a first-principles model. Furthermore, the measured aerial image at the best focus can be employed to calibrate the model for predicting the resist critical dimension. In optional step 1626, the local sensor non-flatness errors can be calculated by subtracting the determined best focus map from a uniform reference map. The non-flatness error map is then stored for future sensor array non-flatness calibration.

Figure 17:
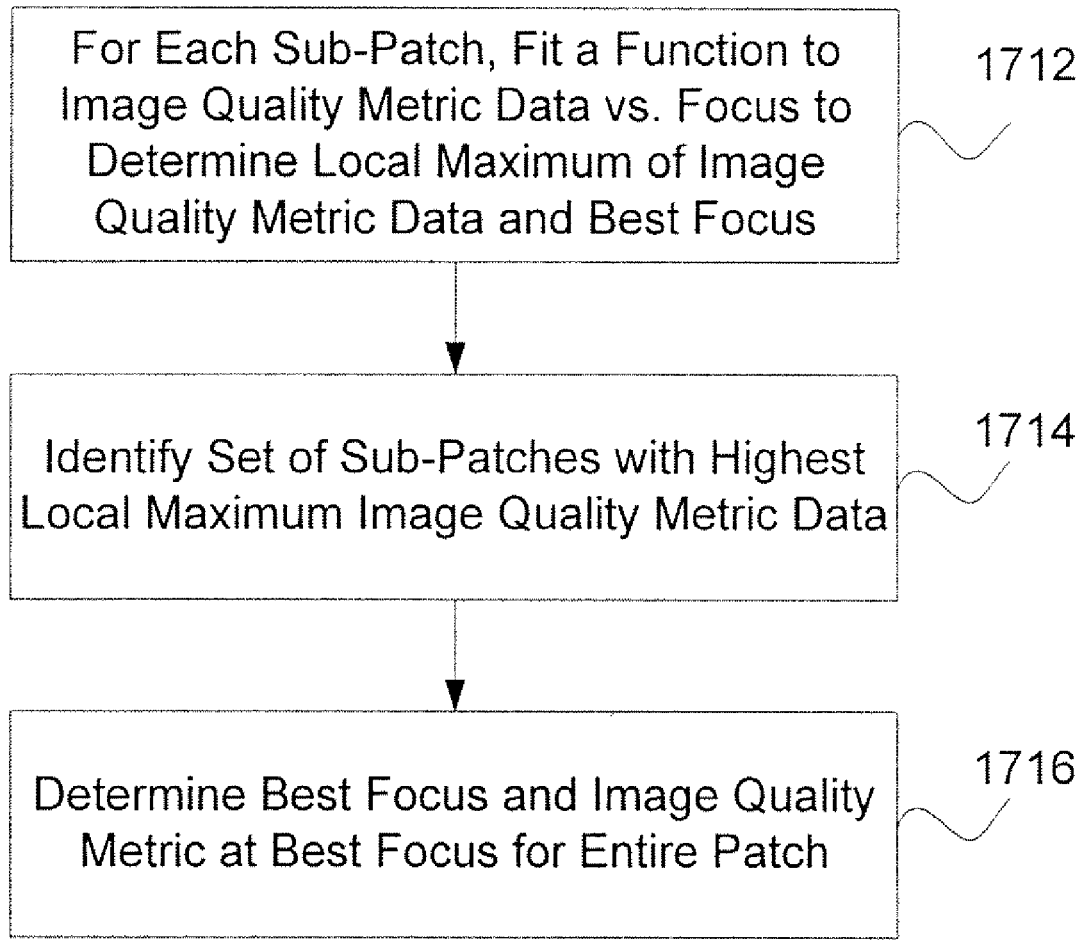
FIG. 17 is a flowchart of method steps for implementing a step of FIG. 15 for determining a best focus for each measured patch, according to one embodiment of the present invention.

FIG. 17 is a flowchart of method steps for implementing step 1516 of FIG. 15 for determining a best focus for each measured patch, according to one embodiment of the invention. To obtain better fitting accuracy, a best focus for each measured patch is determined in three steps. First, in step 1712, for each sub-patch of each measured patch, a parametric function, preferably the function selected in optional step 1512, is fit to the image quality metric data, e.g., image slope or image contrast, versus focus position to determine a local maximum of the image quality metric. A best focus for each sub-patch is then determined from the fitted function as described above in conjunction with FIG. 8. Second, in step 1714, a set of sub-patches with the highest local maximum image quality metric values is identified for each patch. The sub-patches with low image quality metric values are dropped out. The size of the set of sub-patches may be predetermined or dynamically determined based on the patch size and the distribution of the image quality metric data. Finally, in step 1716, the best focus position for the entire patch is determined. The best focus position may be determined by averaging the best focus values of the identified sub-patches, or performing a weighted average of the best focus values of the identified sub-patches where the weighting factor is a measure of the goodness of fit for each identified sub-patch, or by computing the statistical distribution of the best focus values of the identified sub-patches and computing the mean of the distribution. Accordingly, after the best focus position for the entire patch is determined, the best image quality metric for the entire patch can be determined.

Figure 18:
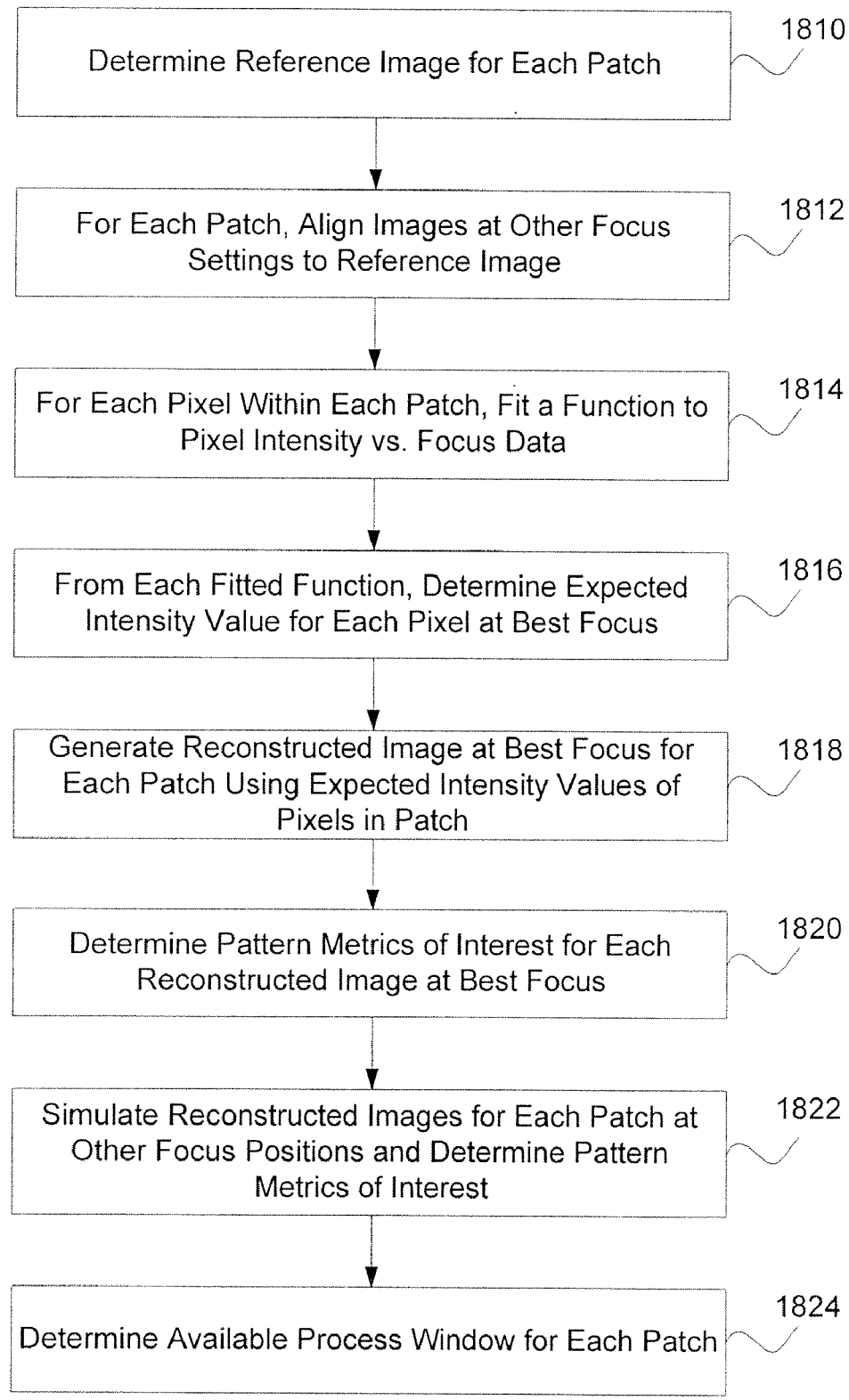
FIG. 18 is a flowchart of method steps for implementing a composite image formation step of FIG. 15, according to one embodiment of the present invention.

FIG. 18 is a flowchart of method steps for implementing step 1518 of FIG. 15 to generate a reconstructed image at best focus and other focus settings for each patch, according to one embodiment of the invention. In step 1810, a reference image for each patch is selected by using the best focus determined in step 1516, as described above in conjunction with FIG. 17. The measured aerial image at the focal plane that is nearest to the best focus location is selected as the reference image. In step 1812, for each patch, the images measured at all other focal planes are aligned to the reference image to eliminate lateral offsets between the measured images. In step 1814, for each pixel within each patch, a function is fitted to the measured intensity value of each pixel vs. focus, as described above in conjunction with FIG. 14A. In step 1816, for each fitted function, an expected intensity value for each pixel at the best focus is determined from the fitted function. In step 1818, a reconstructed image for each patch is generated using the expected intensity values at best focus for each pixel in the patch. In step 1820, pattern metrics of interest for each reconstructed image at best focus are determined by measuring the patterns in the reconstructed image. The pattern metrics of interest may include critical dimension, line-end pullback, pattern necking, or pinching. In step 1822, reconstructed images at other focus positions are generated using the function fitted to the measured pixel intensity value versus focus position as described above in conjunction with FIG. 14B. Then, pattern metrics of interest for each reconstructed image are determined. In step 1824, an available process window is determined for each patch by determining which pattern metrics for the reconstructed images at best focus and the reconstructed images through varying values of focus fall within accepted tolerances for the lithography process. The focus positions that correspond to the reconstructed images that fall within the accepted tolerances define the focus range of the process window.

Figure 19:
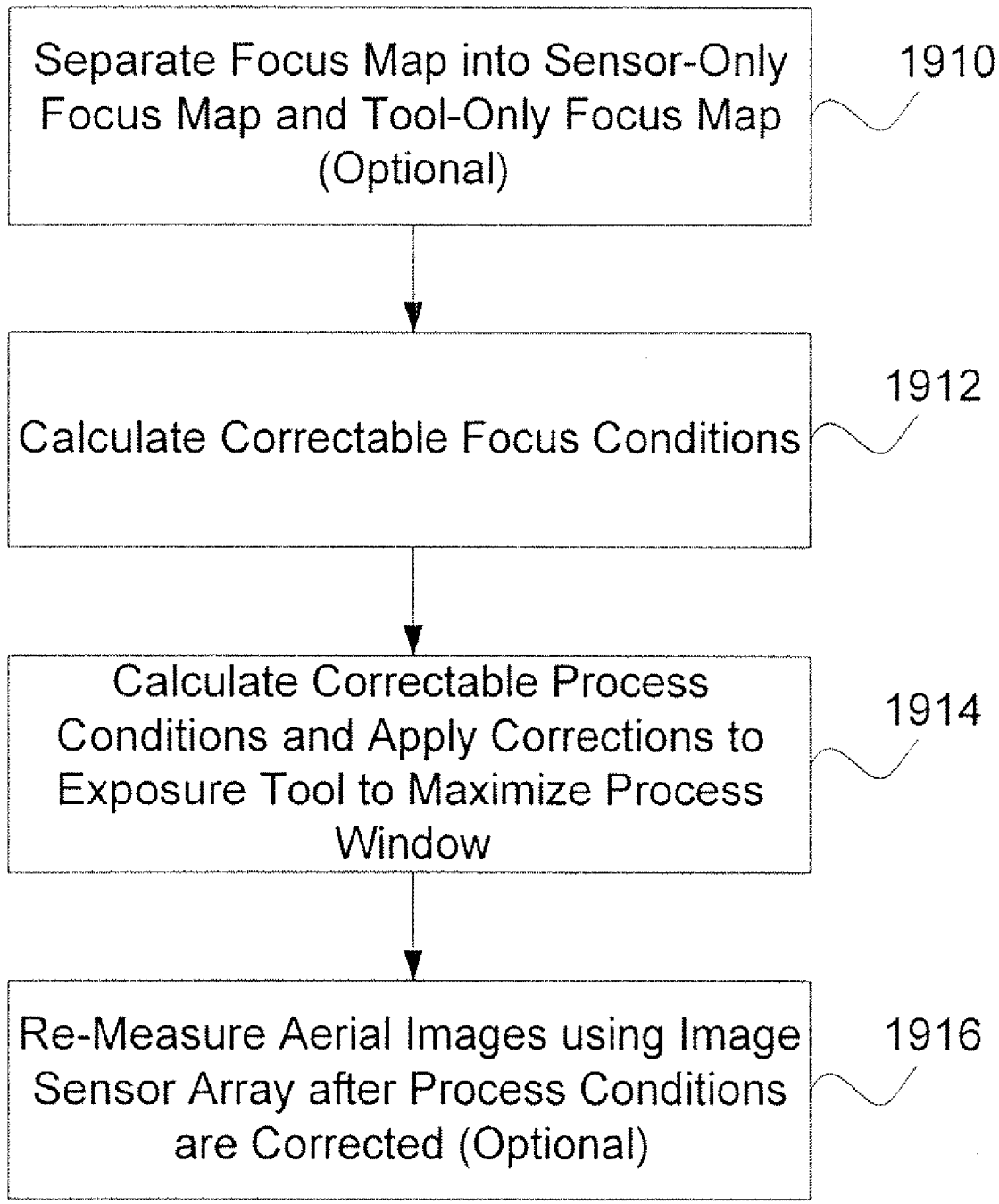
FIG. 19 is a flowchart of method steps for implementing a process correction calculation step of FIG. 15, according to one embodiment of the present invention.

FIG. 19 is a flowchart of method steps for implementing step 1520 of FIG. 15 to calculate process corrections, according to one embodiment of the invention. In optional step 1910, the focus map is separated into a sensor-only focus map relating to the non-flatness of image sensor array 106 and a tool-only focus map relating to the focus errors resulting from the exposure tool.

The separation in step 1910 can be accomplished in several ways. First, a map of the non-flatness of image sensor array 106 can be created in optional step 1512 of FIG. 15 and applied to all data collected with image sensor array 106. In this case, any additional measured non-flatness would be designated as exposure field deviation, and any correctable non-flatness terms (e.g., tilt, one-dimensional oscillation along the scan direction) determined from this analysis could be applied as exposure tool corrections.

Second, a focus map of the known focal plane imperfections of the exposure tool can be provided by an external source (exposure tool self-metrology or independent measurements by other metrology means). In this case, any additional measured non-flatness would be designated as the non-flatness of image sensor array 106. Any deviations of the focus map of image sensor array 106 determined in this manner could be compared to the stored focus maps of image sensor array 106 and used to detect deterioration or deformity in image sensor array 106.

Third, exposure tool focus and leveling sensor data collected during or prior to exposure can be used to map the non-flatness of image sensor array 106. This data could be used directly, just as the stored focus map of image sensor array 106 in the first implementation above. The measured focus map could also be compared to the stored focus maps of the measured non-flatness of image sensor array 106 to detect the deterioration or distortion of image sensor array 106, as in the second implementation above.

Fourth, as described above in conjunction with FIGS. 12A-13C, image sensor array 106 can be rotated by a multiple or multiples of 90 degrees and exposed as a function of focus. The computed focus maps from these alternate orientations can be compared to the normal orientation. Any focal plane deviation can be uniquely determined as either arising from non-flatness of image sensor elements 200 or resulting from non-flatness of the focal plane of the exposure tool.

In step 1912, correctable focus conditions of the exposure tool (e.g., offset, tilt, local focus, or tilt errors along and across the scan direction) are calculated. For example, tilt or curvature of each patch may be determined by fitting appropriate parametric functions to the focus map of the best focus for each patch vs. its position within the exposure field. Other correctable focus conditions include certain slow-varying exposure tool lens aberrations. In step 1914, process corrections for correctable process conditions (e.g., exposure dose offset, illumination intensity distribution, optical conditions, or adjustable lens parameters) are calculated to minimize critical dimension errors and/or to maximize the available process window. For example, a better pattern uniformity can be obtained by removing tilt in the focal plane caused by the exposure tool or a larger focus window can be tolerated by removing focus errors. The process corrections are then applied to the exposure tool. In optional step 1916, aerial images are re-measured using image sensor array 106 at the corrected process conditions to confirm the effectiveness of the corrections.

Figure 20:
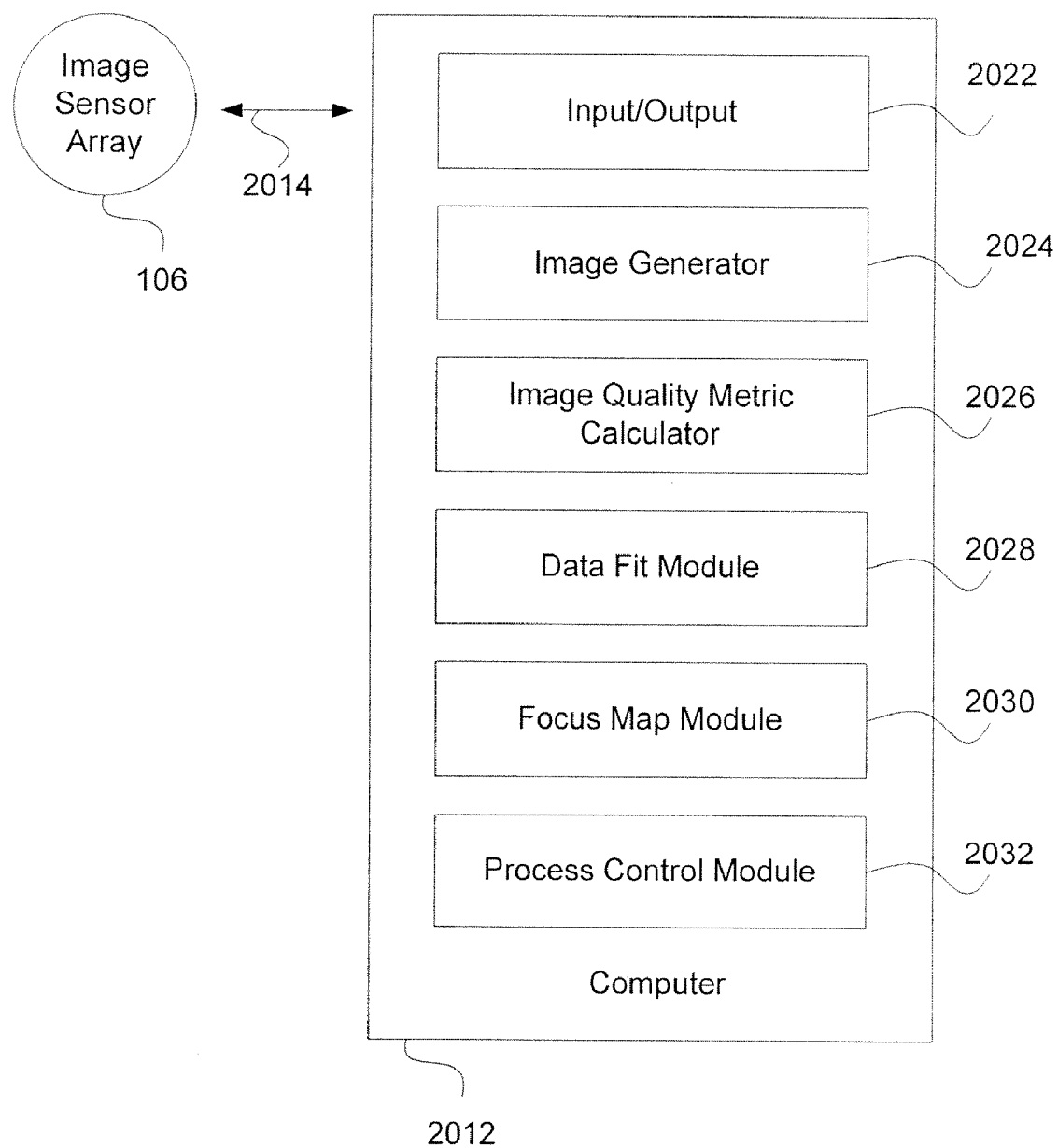
FIG. 20 is a diagram of one embodiment of a system for monitoring focal plane variations in an exposure tool, according to the invention.

FIG. 20 is a diagram of one embodiment of a system for monitoring focal plane variations in an exposure tool, according to the invention. Image sensor array 106 is in communication with a computer 2012 via communication pathway 2014. In one embodiment, computer 2012 resides with image sensor array 106 in an image sensor unit capable of being loaded onto the wafer stage of an exposure tool. In another embodiment, computer 2012 is remote from image sensor array 106 and communication pathway 2014 may be a wireless link.

Computer 2012 includes, but is not limited to, an input/output module 2022, an image generator 2024, an image quality metric calculator 2026, a data fit module 2028, a focus map module 2030, and a process control module 2032. Image generator 2024 is configured to receive image data from image sensor array 106 at a plurality of focal planes in an exposure tool and construct measured aerial images using the image data. Image generator 2024 is also configured to generate reconstructed images at any focus position by interpolating the measured aerial images measured at a plurality of focal planes to the interested focus position or by using a function fit to image intensity data vs. focus position determined by data fit module 2028. Image quality metric calculator 2026 is configured to calculate image quality metric data versus focus for the measured aerial images. The image quality metric data may include image intensity, image contrast, image log slope, or line width measurements. Data fit module 2028 is configured to fit a function to the image quality metric data versus focus setting. The function may be chosen by a user from a set of possible functions or may be a predetermined function for a particular type of image quality metric data. Data fit module 2028 is also configured to determine a best focus for a measured aerial image for an image sensor element of image sensor array 106 by determining a focus position that corresponds to a maximum of the function fit to the image quality metric data. Focus map module 2030 is configured to create a focus map that reflects differences between a best focus for each image sensor element of image sensor array 106 and a nominal best focus of an exposure tool. Process control module 2032 is configured to determine correctable errors in a lithography process performed by an exposure tool using the reconstructed images generated by image generator 2024.

The invention has been described above with reference to specific embodiments. It will, however, be evident that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A method for identifying focal plane variations comprising:
    measuring aerial images using an image sensor array at a plurality of focal planes in an exposure tool, the image sensor array including a plurality of image sensor elements;
    determining a value for at least one image quality metric for the aerial image measured by each image sensor element at each of the plurality of focal planes to produce image quality metric data for each image sensor element comprising the determined values respectively corresponding to each of the plurality of focal planes;
    fitting a parametric function to the image quality metric data for each image sensor element, the parametric function being a function of focus;
    determining a best focus for each image sensor element using the fitted parametric function;
    calculating a difference between the best focus for each image sensor element and a nominal best focus setting of the exposure tool; and
    creating a focal plane map corresponding to the combination of the image sensor array and the exposure tool that indicates the calculated differences between the best focuses of the image sensor elements and the nominal best focus setting.

2. The method of claim 1, further comprising:
    producing aerial images using a mask including test patterns; and
    calibrating the focal plane map to distinguish between contributions of the image sensor array and the exposure tool.

3. The method of claim 1, wherein the image sensor array is disposed in an image sensor unit that is capable of being loaded into the wafer stage of the exposure tool.

4. The method of claim 1, wherein the image sensor array is disposed in an image sensor unit that is integrated into the exposure tool.

5. The method of claim 1, wherein the image quality metric data are one or more values of image intensity, image log slope (ILS), image contrast, or critical dimension.

6. The method of claim 1, wherein the parametric function is one of a polynomial function, a Fourier series, a first-principles model, or a look-up table generated by simulation or calibration measurements.

7. The method of claim 2, further comprising mapping variations in optical aberrations that affect a best focus position of a projection lens of the exposure tool.

8. The method of claim 7, wherein the optical aberrations are astigmatism and spherical aberration.

9. The method of claim 7, further comprising using a set of optical aberration sensitive test patterns.

10. The method of claim 9, wherein the set of optical aberration sensitive test patterns includes a set of line-space patterns with varying pitches and varying orientations.

11. The method of claim 2, further comprising generating a plurality of focal plane maps from aerial images measured at different image sensor array orientations achieved by rotating the image sensor array by a multiple or multiples of 90 degrees to distinguish non-flatness contributions between the image sensor array and the exposure tool.

12. The method of claim 1, further comprising:
creating additional focal plane maps at different times to monitor changes in a focal plane of the exposure tool.

13. The method of claim 12, further comprising:
comparing the monitored changes in the focal plane to an averaged focal plane map over time to provide an early warning of a negative impact on exposure tool performance.

* * * * *